(12) United States Patent
Mathews et al.

(10) Patent No.: US 11,405,701 B2
(45) Date of Patent: *Aug. 2, 2022

(54) INSTANTANEOUS ENERGY RESOURCE USE MONITORING AND CUSTOMER ENGAGEMENT SERVER

(71) Applicant: COPPER LABS, INC., Boulder, CO (US)

(72) Inventors: Jeffrey P. Mathews, Hygiene, CO (US); Daniel J. Forman, Boulder, CO (US); Christopher P. Meyer, Nederland, CO (US); Michael L. Russo, Boulder, CO (US)

(73) Assignee: Copper Labs, Inc., Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/812,721

(22) Filed: Mar. 9, 2020

(65) Prior Publication Data

US 2020/0288221 A1 Sep. 10, 2020

Related U.S. Application Data

(60) Provisional application No. 62/815,418, filed on Mar. 8, 2019, provisional application No. 62/815,426, filed (Continued)

(51) Int. Cl.
*H04Q 9/02* (2006.01)
*G06Q 50/06* (2012.01)
(Continued)

(52) U.S. Cl.
CPC ............... *H04Q 9/02* (2013.01); *G01D 4/006* (2013.01); *G01D 4/02* (2013.01); *G01R 19/0092* (2013.01);
(Continued)

(58) Field of Classification Search
CPC ........ H04Q 9/00; H04Q 9/02; H04Q 2209/00; H04Q 2209/10; H04Q 2209/40;
(Continued)

(56) References Cited

U.S. PATENT DOCUMENTS 5,914,672 A 6/1999 Glorioso et al.
6,996,399 B2 2/2006 Zinn
(Continued)

*Primary Examiner* — Franklin D Balseca
(74) *Attorney, Agent, or Firm* — Richard K. Huffman; Huffman Patent Group, LLC

(57) ABSTRACT

A system for resource monitoring includes: a resource server that monitors use of a resource, the server including: a meter reading processor, that communicates with resource monitors disposed within radio range of resource meters, where the resource meters transmit radio signals indicative of meter identifiers and current readings, and where the each of the resource monitors receives and decodes one or more of the radio signals to obtain one or more of the meter identifiers and current readings, and where the each of the resource monitors transmits the one or more of the meter identifiers and current readings over the internet cloud, and where the meter reading processor updates corresponding records in a resource database that indicate resource consumption of corresponding facilities; and an engagement
(Continued)

processor, that causes alerts to be transmitted to client devices based on analyses of resource consumption that notify users of the unusual patterns of consumption.

20 Claims, 14 Drawing Sheets

Related U.S. Application Data on Mar. 8, 2019, provisional application No. 62/815,421, filed on Mar. 8, 2019.

(51) Int. Cl.

| | |
|---|---|
| *H04W 4/38* | (2018.01) |
| *G01D 4/00* | (2006.01) |
| *G06Q 30/04* | (2012.01) |
| *G01D 4/02* | (2006.01) |
| *G01R 19/00* | (2006.01) |
| *H04L 67/55* | (2022.01) |
| *G06N 20/00* | (2019.01) |
| *G06N 5/04* | (2006.01) |
| *H04L 67/10* | (2022.01) |

(52) U.S. Cl.
CPC .............. *G06Q 30/04* (2013.01); *G06Q 50/06* (2013.01); *H04L 67/26* (2013.01); *H04W 4/38* (2018.02); *G06N 5/04* (2013.01); *G06N 20/00* (2019.01); *H04L 67/10* (2013.01); *H04Q 2209/10* (2013.01); *H04Q 2209/40* (2013.01); *H04Q 2209/60* (2013.01)

(58) Field of Classification Search
CPC .. H04Q 2209/60; H04Q 2209/70; G01D 4/02; G01D 4/002; G01D 4/004; H04W 4/38; G01R 19/0092; G06Q 30/04; G06Q 50/06; H04L 67/10; H04L 67/26; G06N 20/00; G06N 5/04
See application file for complete search history.

(56) References Cited

U.S. PATENT DOCUMENTS

| | | | |
|---|---|---|---|
| 7,304,587 B2 * | 12/2007 | Boaz ..................... | H04Q 9/00 340/870.02 |
| 7,515,627 B2 | 4/2009 | Liu et al. | |
| 7,626,511 B2 | 12/2009 | Lazar | |
| 7,714,735 B2 | 5/2010 | Rockwell | |
| 8,125,946 B2 | 2/2012 | Csapo | |
| 9,173,011 B2 * | 10/2015 | Robinson ............... | G01D 4/002 |
| 9,198,204 B2 | 11/2015 | Mathews et al. | |
| 9,237,470 B2 | 1/2016 | Willig et al. | |
| 9,322,668 B2 | 4/2016 | Hurri et al. | |
| 9,372,213 B2 * | 6/2016 | Auguste ............. | G01R 19/2513 |
| 10,119,835 B2 * | 11/2018 | Carpenter ............. | G01D 4/002 |
| 10,180,451 B2 | 1/2019 | Schweitzer, III et al. | |
| 10,343,874 B2 | 7/2019 | Scoville et al. | |
| 10,495,674 B2 | 12/2019 | Saneyoshi et al. | |
| 10,581,237 B2 | 3/2020 | Schweitzer, III et al. | |
| 2005/0270173 A1 | 12/2005 | Boaz | |
| 2007/0211768 A1 | 9/2007 | Cornwall et al. | |
| 2008/0106434 A1 | 5/2008 | Winter | |
| 2008/0136667 A1 | 6/2008 | Vaswani et al. | |
| 2009/0112758 A1 | 4/2009 | Herzig | |
| 2009/0225811 A1 | 9/2009 | Albert et al. | |
| 2010/0156665 A1 | 6/2010 | Krzyzanowski et al. | |
| 2012/0022812 A1 | 1/2012 | Longtin | |
| 2014/0295261 A1 | 10/2014 | Miyake et al. | |
| 2015/0012147 A1 * | 1/2015 | Haghighat-Kashani ..................... | G06Q 50/06 700/291 |
| 2016/0109262 A1 | 4/2016 | Robinson et al. | |
| 2018/0183889 A1 | 6/2018 | Meriac et al. | |
| 2018/0309818 A1 | 10/2018 | Park et al. | |
| 2019/0096148 A1 | 3/2019 | Hopkins et al. | |
| 2019/0186952 A1 | 6/2019 | Schwartz et al. | |
| 2019/0327161 A1 | 10/2019 | Cannell et al. | |
| 2020/0275546 A1 | 8/2020 | Marshal et al. | |
| 2020/0400461 A1 * | 12/2020 | Malagon ............... | H04B 1/7156 |

* cited by examiner

*MONITOR COMMISSIONING AND PAIRING VIA METER IMAGE*

MONITOR COMMISSIONING AND PAIRING VIA BILL IMAGE

FIG. 12 — EXEMPLARY USAGE DISPLAY

FIG. 13  EXEMPLARY NOTIFICATION DISPLAY

FIG. 14 — EXEMPLARY DEMAND MANAGEMENT DISPLAY

INSTANTANEOUS ENERGY RESOURCE USE MONITORING AND CUSTOMER ENGAGEMENT SERVER

CROSS-REFERENCE TO RELATED APPLICATIONS

This application claims the benefit of the following U.S. Provisional applications, each of which is herein incorporated by reference in its entirety.

| Ser. No. | FILING DATE | TITLE |
| --- | --- | --- |
| 62/815,418 | Mar. 8, 2019 | APPARATUS AND METHOD FOR MACHINE TO LEARN A RADIO HOPPING SEQUENCE WITH A SINGLE NARROW BAND RADIO OVER A LONG PERIOD OF TIME |
| 62/815,421 | Mar. 8, 2019 | APPARATUS AND METHOD FOR PAIRING OF UTILITY METERS TO SMARTPHONE AND CLOUD SERVICES |
| 62/815,426 | Mar. 8, 2019 | APPARATUS AND METHOD FOR DISAGGREGATION OF ENERGY USAGE FROM THE WHOLE HOME TO GENERATE USEFUL ALERTS TO SMARTPHONE USERS |

This application is related to the following co-pending U.S. patent applications, each of which has a common assignee and common inventors, the entireties of which are herein incorporated by reference.

| Ser. No. | FILING DATE | TITLE |
| --- | --- | --- |
| 16/812,666 | Mar. 9, 2020 | METHOD AND APPARATUS FOR INSTANTANEOUS ENERGY RESOURCE USE MONITORING AND CUSTOMER ENGAGEMENT |
| 16/812,749 | Mar. 9, 2020 | APPARATUS AND METHOD FOR TRANSLATING AUTOMATIC METER READING SIGNALS TO INSTANTANEOUS METER READINGS |
| 16/812,791 | Mar. 9, 2020 | METHOD AND APPARATUS FOR DETECTION AND ALERT OF ENERGY RESOURCE OUTAGES |

BACKGROUND OF THE INVENTION

Field of the Invention

This invention relates in general to the field of energy resource management, and more specifically to methods and apparatus for instantaneous energy resource use monitoring and customer engagement.

Description of the Related Art

Since late in the 1800's, electrical power, natural gas, and water providers have been distributing these resources to consumers. And not long after larger distribution grids were deployed by these utilities, the problem of billing based upon consumption arose. Consequently, utilities began to install consumption meters for these resources at their respective points of consumption.

Virtually everyone in this country and many countries abroad understand the role of the "meter reader," for early utility meters provided only a visual indication of how much of a certain resource that was consumed over a billing period. Thus, in order for a resource provider to determine the amount of that resource which had been consumed over a billing period, it was necessary to dispatch personnel each time a meter reading was required. This typically occurred on a monthly basis.

This manner of obtaining usage data, however, was labor intensive and consequently very costly. In addition, because the act of reading a meter involved interpretation of the meaning of one or more visual indicators (typically analog dials), these readings were subject to inaccuracies due to errors made by the meter readers.

In the past 30 years, developers began to address the problems of labor cost and inaccurate readings due to the human element by providing automatic meter reading (AMR) meters, the most prevalent type of which broadcast their current values in a known and encoded low power radio frequency transmission capable of being captured by a corresponding AMR receiver in a moving vehicle. Hence, AMR technologies substantially alleviated the limitations of former meters related to accurate readings and markedly addressed the cost of labor required to read meters.

But in order to deploy AMR technologies, the utilities had to completely replace their existing inventory of meters, literally hundreds of millions, at substantial costs which were conveyed either directly or indirectly to consumers.

In the past 20 years, developers have responded to pulls in the art for "smart meters," that is, meters that allow for two-way communication between a resource provider and a point of consumption. Two-way communications between a provider and a meter, also known as automated metering infrastructure (AMI) yields several benefits to the provider. At a basic level, the provider is no longer required to send out personnel to read meters or to control consumption as an access point. In addition, the provider can turn on and turn off consumption of the resource at the consumption point without sending out service personnel. And what is more attractive from a provider standpoint is that AMI techniques can be employed to perform more complex resource control operations such as demand response. AMI meters typically provide their readings every 15 minutes over a backhaul network that is battery backed, and these readings may be available to consumers the following day.

The present inventors have observed, however, that to provide for AMI, under present day conditions, requires that the utilities—yet one more time—replace their entire inventory of AMR meters with more capable, and significantly more expensive, AMI meters. In addition, present day approaches that are directed toward providing the two-way communications between the utilities and their fleet of AMI meters all require the deployment and monthly maintenance fees associated with entirely new communications infrastructures (e.g., proprietary field area networks, satellite) or they are bandwidth limited (e.g., cellular).

Because of the costs associated with upgrading infrastructure when compared to the benefits gained in consumption reduction, attempts to replace older meters has stalled. Moreover, the mass adoption of electric vehicles and residential photovoltaic systems makes it even more difficult to establish rate cases and payback of such capital expenditure.

Presently, about half of combined electric, gas, and water utilities in this country can access meter data more frequently than once a month. About 6 percent of deployed meters do not have communication capabilities, 47 percent are AMI meters, and the remaining 47 percent are AMR meters. Consequently, utilities can't engage consumers with real-time energy data and it's expensive to serve unexpected peaks in demand. In addition, the present inventors have noted that approximately 90 percent of all power outages occur due to faults in the distribution grid itself, and that resolving an outage is a critical component of customer satisfaction; however, responding to those outages is difficult because lack of real-time data and information at the edges of the grid.

Accordingly, what is needed is a method and apparatus for translating AMI meter and AMR meter readings into real-time energy consumption streams that are available for grid monitoring and customer engagement, without requiring modifications to existing infrastructure or physical coupling of monitoring devices to distribution points.

What is also needed is a system that monitors consumption of an energy resource within a grid in real time, and that more accurately targets repair resources over that which has heretofore been provided.

What is additionally needed is a system for monitoring distribution of an energy resource that does not rely on self-reporting of failure, and that also is capable of distinguishing between grid failure and communications network failure.

Moreover, what is needed is a home energy monitoring system that is easy to install, that utilizes commercially available broadband networks, that analyzes usage to account for variations in usage due to weather, that can distinguish between normal and abnormal usage, that can be employed by resource providers in real time to initiate demand reduction, and that can be employed by resource consumers to identify unusual consumption patterns.

SUMMARY OF THE INVENTION

The present invention, among other applications, is directed to solving the above-noted problems and addresses other problems, disadvantages, and limitations of the prior art by providing a superior technique for translating infrequent readings from both Automatic Meter Reading (AMR) meters and Advanced Metering Infrastructure (AMI) meters into a real-time stream of revenue-grade readings for a variety of energy resource types and for additionally analyzing streams of readings to determine and alert resource users and resource providers to abnormal use patterns and outages. One aspect of the present invention contemplates a system for instantaneous resource monitoring and engagement, the system including: a resource server, coupled to the internet cloud, that monitors use of a resource, and that engages resource users when unusual patterns of resource consumption are detected, the resource server including: a meter reading processor, configured to communicate with a plurality of resource monitors that are each disposed within radio range of a corresponding plurality of resource meters, where the resource meters transmit corresponding radio signals indicative of corresponding meter identifiers and current readings, and where the each of the plurality of resource monitors receives and decodes one or more of the corresponding radio signals to obtain one or more of the corresponding plurality of meter identifiers and current readings, and where the each of the plurality of resource monitors transmits the one or more of the corresponding plurality of meter identifiers and current readings over the internet cloud, and where the meter reading processor creates and updates a corresponding plurality of records in a resource database that indicate resource consumption of corresponding facilities; and an engagement processor, that causes alerts to be transmitted to one or more client devices based on analyses of corresponding resource consumption, where the alerts notify corresponding users of the unusual patterns of resource consumption.

Another aspect of the present invention envisages a system for instantaneous resource monitoring and engagement, the system including: a resource server, coupled to the internet cloud, that monitors use of a resource, and that engages resource users when unusual patterns of resource consumption are detected, the resource server including: a meter reading processor, configured to communicate with a plurality of resource monitors that are each disposed within radio range of a corresponding plurality of resource meters, where the resource meters transmit corresponding radio signals indicative of corresponding meter identifiers and current readings, and where the each of the plurality of resource monitors receives and decodes one or more of the corresponding radio signals to obtain one or more of the corresponding plurality of meter identifiers and current readings, and where the each of the plurality of resource monitors transmits the one or more of the corresponding plurality of meter identifiers and current readings over the internet cloud, and where the meter reading processor creates and updates a corresponding plurality of records in a resource database that indicate resource consumption of corresponding facilities; a disaggregation processor, configured to analyze the plurality of records to distinguish between normal and abnormal usage patterns by the corresponding facilities, and to detect the unusual patterns of resource consumption; and an engagement processor, that causes alerts to be transmitted to one or more client devices based on analyses of corresponding resource consumption, where the alerts notify corresponding users of the unusual patterns of resource consumption.

A further aspect of the present invention comprehends a method for instantaneous resource monitoring and engagement, the method including: monitoring use of a resource, the monitoring including: communicating with a plurality of resource monitors that are each disposed within radio range of a corresponding plurality of resource meters, where the resource meters transmit corresponding radio signals indicative of corresponding meter identifiers and current readings, and where the each of the plurality of resource monitors receives and decodes one or more of the corresponding radio signals to obtain one or more of the corresponding plurality of meter identifiers and current readings, and where the each of the plurality of resource monitors transmits the one or more of the corresponding plurality of meter identifiers and current readings over the internet cloud; creating and updating a corresponding plurality of records in a resource database that indicate resource consumption of corresponding facilities; and transmitting alerts to one or more client devices based on analyses of corresponding resource consumption, where the alerts notify corresponding users of the unusual patterns of resource consumption.

BRIEF DESCRIPTION OF THE DRAWINGS

These and other objects, features, and advantages of the present invention will become better understood with regard to the following description and accompanying drawings where.

DETAILED DESCRIPTION

Figure 1:
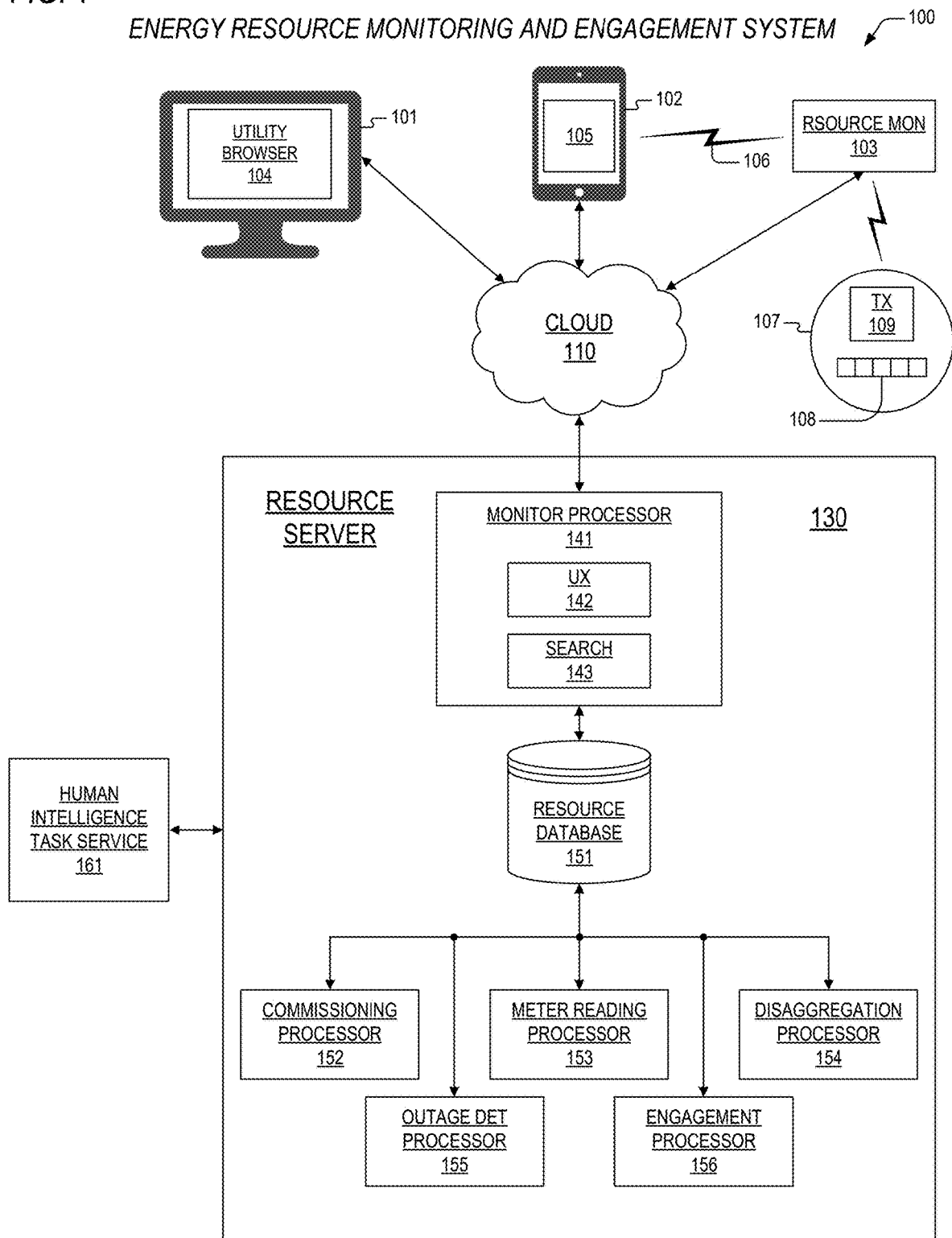
FIG. 1 is a block diagram illustrating an energy resource monitoring and engagement system according to the present invention.

Exemplary and illustrative embodiments of the invention are described below. It should be understood at the outset that, although exemplary embodiments are illustrated in the figures and described below, the principles of the present disclosure may be implemented using any number of techniques, whether currently known or not. In the interest of clarity, not all features of an actual implementation are described in this specification, for those skilled in the art will appreciate that in the development of any such actual embodiment, numerous implementation-specific decisions are made to achieve specific goals, such as compliance with system-related and business-related constraints, which vary from one implementation to another. Furthermore, it will be appreciated that such a development effort might be complex and time-consuming, but would nevertheless be a routine undertaking for those of ordinary skill in the art having the benefit of this disclosure. Various modifications to the preferred embodiment will be apparent to those skilled in the art, and the general principles defined herein may be applied to other embodiments. Therefore, the present invention is not intended to be limited to the particular embodiments shown and described herein but is to be accorded the widest scope consistent with the principles and novel features herein disclosed.

The present invention will now be described with reference to the attached figures. Various structures, systems, and devices are schematically depicted in the drawings for purposes of explanation only and so as to not obscure the present invention with details that are well known to those skilled in the art. Nevertheless, the attached drawings are included to describe and explain illustrative examples of the present invention. Unless otherwise specifically noted, articles depicted in the drawings are not necessarily drawn to scale.

The words and phrases used herein should be understood and interpreted to have a meaning consistent with the understanding of those words and phrases by those skilled in the relevant art. No special definition of a term or phrase (i.e., a definition that is different from the ordinary and customary meaning as understood by those skilled in the art) is intended to be implied by consistent usage of the term or phrase herein. To the extent that a term or phrase is intended to have a special meaning (i.e., a meaning other than that understood by skilled artisans) such a special definition will be expressly set forth in the specification in a definitional manner that directly and unequivocally provides the special definition for the term or phrase. As used in this disclosure, "each" refers to each member of a set, each member of a subset, each member of a group, each member of a portion, each member of a part, etc.

Applicants note that unless the words "means for" or "step for" are explicitly used in a particular claim, it is not intended that any of the appended claims or claim elements are recited in such a manner as to invoke 35 U.S.C. § 112(f).

Definitions

Central Processing Unit (CPU): The electronic circuits (i.e., "hardware") that execute the instructions of a computer program (also known as a "computer application," "application," "application program," "app," "computer code," "code process," "code segment," or "program") by performing operations on data that may include arithmetic operations, logical operations, and input/output operations. A CPU may also be referred to as a processor.

Thin client: A thin client is an application program executing on a computing device (e.g., desktop computer, laptop computer, tablet computer, smartphone, etc.) that runs from resources stored on a central server instead of a localized hard drive. Thin clients work by connecting remotely to a server-based computing environment where most applications, sensitive data, and memory, are stored.

In view of the above background discussion on the various types of energy resource meters, how readings of energy use are taken therefrom, and the disadvantages and limitations of these meters in view of present-day energy resource demand, a discussion of the present invention will be presented with reference to FIGS. 1-15. The present invention overcomes the above noted limitations of present-day meter reading systems and techniques by providing a method and system for translating infrequent readings from both Automatic Meter Reading (AMR) meters and Advanced Metering Infrastructure (AMI) meters into a real-time stream of revenue-grade readings for a variety of energy resource types including, but not limited to, electricity, gas, and water. In addition, the present invention is configured to provide near-real-time alerts to resource providers (e.g., utilities) and engagement notifications to resource users. All of these functions and more are enabled wirelessly without requiring physical access or connection to the meters themselves or to energy resource distribution within user facilities. The present invention provides for a superior inventive step in the art and significant improvements to this field of technology.

Referring to FIG. 1, a block diagram is presented illustrating an energy resource monitoring and engagement system 100 according to the present invention. The system 100 may include a resource server 130 that is coupled to one or more devices energy provider client devices 101 and resource user client devices 102 through the internet cloud 110. In one embodiment, the provider client devices 101 may comprise one or more desktop/laptop computers 101 that execute a conventional web browser 104 such as, but not limited to, MICROSOFT EDGE, APPLE SAFARI, GOOGLE CHROME, and FIREFOX for communication and interaction with the resource server 130 through the internet cloud 110. In one embodiment, the resource user client devices 102 may comprise one or more one or more smart tablet computers 102 that execute tablet client applications 105 for communication and interaction with the resource server 130 through the internet cloud 110. The user client devices 102 may further include one or more smartphone devices 102 that execute smartphone client applications 105 for communication and interaction with the resource server 130 through the internet cloud 110. Other embodiments of the client devices 101-102 are contemplated. Preferably, the client applications 105 comprise thin client applications that enable access via remote connections to the resource server 130.

The system 100 also may include a plurality of resource monitors 103 that are deployed within radio range of a corresponding one or more meters 107 of the types alluded to above. In one embodiment, the system 100 contemplates deployment of approximately five million resource monitors 103 in both residential and commercial facilities, where the monitors 103 are provided to provide real-time streaming of use of a corresponding one or more energy resources. For example, a given resource monitor 103 may be configured to stream electrical meter readings only or it may be configured to stream a combination of electrical, gas, and water readings from a corresponding number of resource meters 107. The present inventors note that a single resource monitor 103, as a function of received signal strength and time allocated to particular frequencies and modulation types, may be configured to received meter readings from a plurality of meters 107 that may or may not correspond to the facility in which the resource monitor 103 is disposed. Stated differently, a single resource monitor 103 may receive and stream meter readings from meters 107 within its corresponding facility and readings from meters 107 disposed within adjacent facilities that are within range, thus providing for increased quality of service. As one skilled in the art will appreciate, radio signals from a meter 107 in an adjacent facility may be higher in signal strength that signals from a meter 107 that is disposed within the same facility as the resource monitor 103.

In one embodiment, the resource monitor 103 may comprise a small, stand-alone device that is plugged into an electrical outlet within a facility, where the electrical outlet is within radio range of one or more meters 107. Another embodiment contemplates resource monitoring elements to perform the functions of a resource monitor 103, but which are disposed within another type of device that is within radio range of one or more meters. Other types of devices within which the resource monitoring elements are disposed may comprise modems (both cable and DSL), set top boxes, smart home devices and digital assistants (e.g., AMAZON ECHO, GOOGLE ASSISTANT, SAMSUNG BIXBY, etc.), intelligent hubs (e.g., SONOS, GOOGLE NEST, LG SMART TV), and any other device that can provide electrical power to the resource monitoring elements and that provide for access so the internet cloud 110 via a wired or wireless gateway (not shown). The present invention further contemplates the sharing of common hardware and software (e.g., power supplies, BLUETOOTH, and WIFI elements) within these other types of devices.

The resource monitor 103 may be coupled to one or more of the user client devices 102 via a Bluetooth link 106, where the Bluetooth link 106 is employed to transfer a user's WIFI access credentials (e.g., SSID and password) in order to commissioning the resource monitor 103 onto the user's WIFI network. Following commissioning, Bluetooth link 106 may be employed as backup means of communication.

An AMI or AMR meter 107 may comprise an analog or digital display 108 that displays a value of resource consumption (e.g., 32451 kWh, 4305 gallons, etc.) by a corresponding facility. The meter 107 may further be configured with a radio transmitter 109 that periodically transmits a unique meter identifier (ID) along with a current value of resource consumption. The radio transmissions may be at a fixed radio frequency or they may frequency hop between a plurality of radio frequencies according to a unique frequency hopping algorithm. As one skilled in the art will appreciate, there are a number of meter transmission protocols currently employed, and the resource monitor 103 according to the present invention is configured to employ an inexpensive, single narrow band receiver, described in more detail below, to discover transmission protocols that correspond to meters 107 within range. As one skilled in the art will appreciate, AMI/AMR meters 107 that are currently deployed utilize transmission protocols based upon manufacturer's specifications. These protocols include fixed frequency protocols and frequency hopping protocols such as, but not limited to, ZigBee SEP 1.0, ZigBee 1.1b, ZigBee 1.2, AMR ERT SCM tone wake, AMR ERT SCM low power, AMR ERT SCM high power, AMR ERT SCMP, and AMR ERT IDM, Cellnet, Kamstrup Wireless M-Bus, Sensus FlexNet FSK7, and Neptune R900. As will be discussed in more detail below, the resource monitor 103 according to the present invention is configured to employ a the narrow band receiver to discover radio transmissions and protocols associated with meters 107 within range and to further employ those protocols to listen for broadcasts by these meters 107, whereby the resource monitor extracts meter IDs and readings in real-time. The meter IDs and readings are then transmitted by the resource monitor 103 to the resource server 130 over the internet cloud for storage, analysis, resource provider alerts, and resource user engagement. In a broader sense, the resource monitor 103 according to the present invention is configured to employ a narrow band receiver to scan for radio signals within range that may be associated with meters 107 and to learn hopping sequences for certain frequency hopping protocols.

The frequencies that are scanned may be limited to those frequencies associated with a geographic area within which the meters 107 are deployed, where the frequencies are provided by the resource server. The scanning may further comprise detecting peaks in received signal strength indicator (RSSI) to trigger further listening for message preambles. The scanning may adjust frequency channels from 902 to 926 MHz, channels within the ISM bank, and 868 MHz. The resource monitor 103 may further adjust modulation (e.g., OOK, FSK, PSK), baud rate (e.g., 2400, 9600, 19200, and 57600), CRC algorithm (CRC-8, CRC-CITT, CRC-32 etc.), and may additionally adjust receiver bandwidth to dynamically find balance between reliable reception and number of unique channels required for hopping, and may further toggle forward error correction (FEC) and Manchester encoding on and off with an objective of matching a received meter ID with a meter 103 corresponding or adjacent to a user's facility. For frequency hopping protocols, the resource monitor 103 may additionally employ a narrowing algorithm, described in more detail below that estimates frequencies and intervals, and that learns based upon number of signal hits, and that improves over time.

The resource server 130 may include a monitor processor 141 that is coupled to a resource database 151. The monitor processor 141 comprises a user interface (UX) component 142 and a search engine component 143. The resource server may further comprise a commissioning processor 152, a meter reading processor 153, a disaggregation processor 154, an outage detection processor 155, and an engagement processor 156. The resource server 130 may further be coupled to a human intelligence task service 161 such as, but not limited to, AMAZON Mechanical Turk (MTurk).

In operation, users may download and install the user client application 105 from the resource server 130 to their client devices 102 via the internet cloud 110. The user client application 105 may execute to prompt a corresponding user to provide power to a corresponding resource monitor 103, and to establish a connection to the resource monitor 103 via the Bluetooth link 106. The user client application 105, in conjunction with the user interface element 142 may additionally prompt the user to enter credentials for their WIFI network, which are transmitted to the resource monitor 103 that then provides these credentials to the user's WIFI access point (not shown), thus commissioning the resource monitor 103 onto the WIFI network.

The user client application 105, as directed by the user interface element 142, may then prompt the user to take digital photographs of meters 107 (e.g., electrical, gas, water, solar, etc.) within their facility that may include current resource consumption values that are on corresponding displays 108 and that may further include visually recognizable meter IDs. In the absence of digital photographs of meters 107, the user may be prompted to take digital photographs of their monthly bills from the resource providers. The user client application 105 may subsequently transmit these digital photographs to the resource server 130. Accordingly, the commissioning processor 152 may cause one or more user records to be created within the resource database 151 having fields therein that include, but are not limited to, user registration information, physical service address, device ID (for push notifications), phone number (for voice calls and SMS messaging) type of resource monitored, meter ID, meter type, meter broadcast protocol, and resource provider name. The commissioning processor 152 may additionally cause meter records to be created within the resource database 151 having fields that include, but are not limited to, meter ID, resource monitors within radio range, time stamps, and corresponding meter readings.

The commissioning processor 152 may employ computer vision learning algorithms to detect meter IDs and current readings from the digital photographs. The commissioning processor 152 may further employ computer vision to determine the type of meter 107 being used and may update user records accordingly. For recognized and well known meters 107, the commissioning processor 153 may additionally provide instructions to the resource monitor 103 that include transmission frequencies and hopping algorithms to reduce the time required to scan and acquire the meter 107.

In the absence of a meter ID, the commissioning processor 152 may direct the resource monitor 103 to listen for meters 107 that have meter readings that are approximately that which was learned from the photograph of the meter's display 108. For those meters 107 that are not recognized via computer vision learning, the commissioning processor 152 may cause the digital photographs to be transmitted as work orders to the human intelligence task service 161 to identify meter type.

For situations where only a monthly bill is provided, the commissioning processor 152 may employ computer vision to determine current and previous consumption readings and may then employ those readings to generate an estimated time-projected consumption reading for the meter 107 and may direct the resource monitor 107 to search for a meter 107 having a current reading that is approximately equal to the estimated consumption reading.

Once the resource monitor 103 has determined one or more specific meters 107 that match the information provided via the digital photographs, the commissioning processor 152 may then direct the resource monitor 103 to take consumption readings for the meter 107 for a prescribed time period to generate a resource consumption baseline. The disaggregation processor 154 may analyze the resource consumption baseline to determine recognizable spikes in usage that correspond to recognized appliances (e.g., washer, air conditioner, dryer, television, furnace, lighting, occupancy, etc.), and the commissioning processor 153 may then direct the monitor processor 141 to send push notifications to the client device 102 asking confirmatory questions such as, but not limited to:

"Did you just turn on your television?"
"Did you do laundry yesterday at 7 PM?"
"Did you get home today around 5:48 PM?"

If the user's answers match the recognized spikes, then the commissioning processor 152 pairs the meter 107 with the resource monitor.

Alternatively, the commissioning processor 153 may direct the monitor processor 141 to send push notifications to the client device 102 asking the user to perform confirmatory actions such as, but not limited to:

"Turn on your oven to 500 degrees."
"Turn on your toaster."
"Turn on your washer."

The commissioning processor 152 may then direct the disaggregation processor 154 may analyze the resource consumption baseline along with current readings to determine recognizable spikes in usage that correspond to the directed action(s). If a match is not found, then the user may be directed to perform additional actions. If a match is found, then the commissioning processor 152 pairs the meter 107 with the resource monitor 103.

Once a meter 107 is paired with one or more resource monitors 103, then the meter reading processor 153 directs the resource monitors to periodically transmit the meter's current readings, which are stored in the resource database 151. The search element 143 may be employed to determine records in the database 151 that correspond to a specific meter ID. In one embodiment, the period of transmission is 30 seconds. Another embodiment contemplates 1-minute periods.

As will be described in more detail below, the disaggregation processor 154 may perform operations on readings corresponding to a meter 107 to normalize usage for weather conditions, for day of the week, and for time of day in order to determine both usual and unusual resource consumption patterns. These normalized readings are additionally stored in the resource database 151 and are used by the engagement processor to send push notifications (or SMS messages) to users that provide alerts for unusual usage and that encourage conservation and demand reduction. In one embodiment, the normalized readings are employed by the engagement processor 156 to filter out unnecessary notifications. In one embodiment, 60-minute time windows are employed by the disaggregation processor 154 to analyze resource consumption. The disaggregation processor 154 then employs an averaged shifted histogram method with data points in bins representing subranges to analyze consumption during each of the windows. The disaggregation processor 154 additionally identifies usage signatures of large appliances and common events (e.g., laundry day) to distinguish normal usage patterns from unusual usage patterns. For example, a user with spikes in water usage during a very dry month of July would not receive a conservation notification. Similarly, a user that runs several loads of laundry on Saturdays would be precluded from notifications on that day. These notifications and corresponding use threshold time profiles are programmed by utility providers through their corresponding browsers 104 and are stored within the resource database 151 for access by the engagement processor 156 at intervals which are also prescribed by the utility providers through their browsers 104. In one embodiment, the engagement processor may employ 5-minute usage windows for purposes of sending alerts to users.

The disaggregation processor 154 may further assign users to categories to provide for additional filtering of alerts. In one embodiment, users are categorized into time windows within which they consume most of a resource such as, but not limited to, morning users, evening users, all day users, day users, night users, weekend users, and non-weekend users. The disaggregation processor 154 additionally analyzes usage patterns to track long term trends that represent increased annual cost or savings such as having installed, replaced or removed appliances like attic fans, pool pumps, televisions, refrigerators, drop freezers, etc. Advantageously, the alerts pushed to the users via the engagement processor 156 enable the users to make informed decisions about the products in their homes and their energy cost and value tradeoffs. The disaggregation processor 154 may additionally track usage patterns to detect occupancy (home and away) and the engagement processor 156 may then alert users to indicated occupancy states of their corresponding facilities.

Advantageously, the alerts provided by the engagement processor 156 based upon disaggregated usage enable facility owners to take immediate action during urgent energy events such as when appliances (e.g., fans, heaters, irons, ovens, warmers, etc.) are left on when not in use or when unusual occupancies are detected.

The outage detection processor 155 operates to analyze current usage for all meters 107 within regions specified by utility providers to which the meters 107 correspond. One embodiment contemplates the generation of visual representations of usage by the monitor processor, which are then transmitted to the provider's web browser. These visual usage displays may include, but are not limited to, current usage, usage over a time period, usage tied to time-of-day charges, demand reduction results, industrial usage, etc. For example, Austin Energy, an electrical resource provider run by the City of Austin, Tex., may employ their browser 104 to specify various grid regions for monitoring. As will be described in further detail below, the outage detection processor 155 may further monitor transmission from meters 107 to resource monitors 103 within range to determine if one or more meters 107 are online or offline. If the status of a given meter 107 is in question, then its on-premise resource monitor 103 may be questionable as well, but a resource monitor 103 in an adjacent facility may be operating normally and may be receiving transmissions from the given meter 107. Accordingly, the outage detection processor 155 does not determine outages based upon lack of power to a resource monitor 103, but rather lack of transmissions from a meter 107 to those resource monitors 103 to which it is paired, be those monitors 103 disposed on site or in adjacent buildings within range. If an outage is determined, the outage detection processor 155 may further determine a physical area of the outage based upon physical coordinates (e.g., addresses) of the non-transmitting meters and may further direct the monitor processor 141 to transmit visual representations and values of the outage to the resource provider's browser 104. In one embodiment, the outage detection processor may employ available public data to augment the visual representations provided such as, but not limited to, outage maps for internet service.

Advantageously, the system 100 according to the present invention provides for a significant improvement in this field of art that includes translation of AMI/AMR meter readings to real-time consumption streams, monitoring of resource consumption use and provision of real-time consumption to utilities that include outage alerts, and user engagement based upon disaggregation and normalization of corresponding use profiles.

Figure 8:
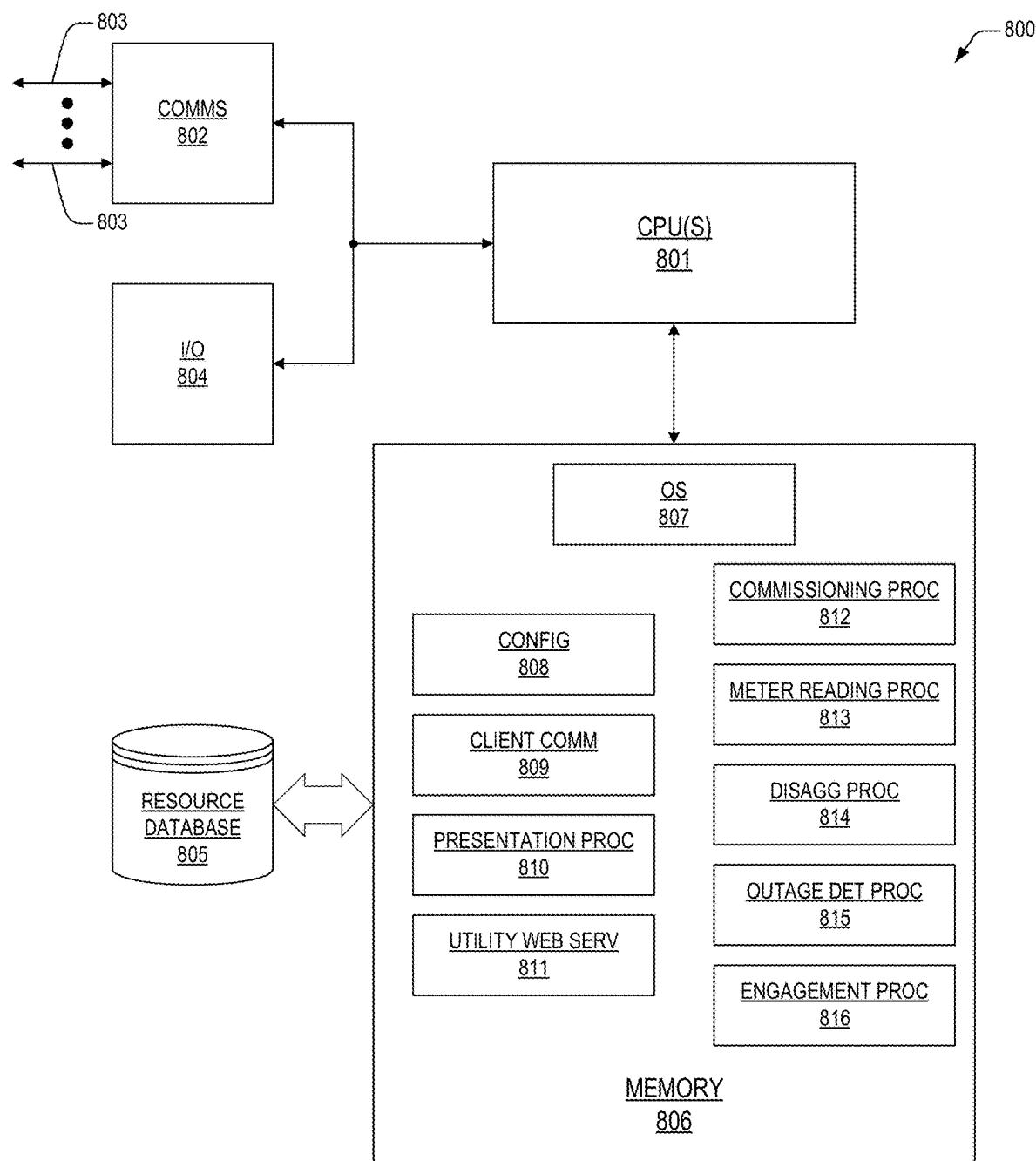
FIG. 8 is a block diagram detailing a resource server according to the present invention.

The resource server 130 according to the present invention may comprise one or more application programs executing thereon to perform the operations and functions described above, and which will be disclosed in further detail with reference to FIG. 8.

Figure 2:
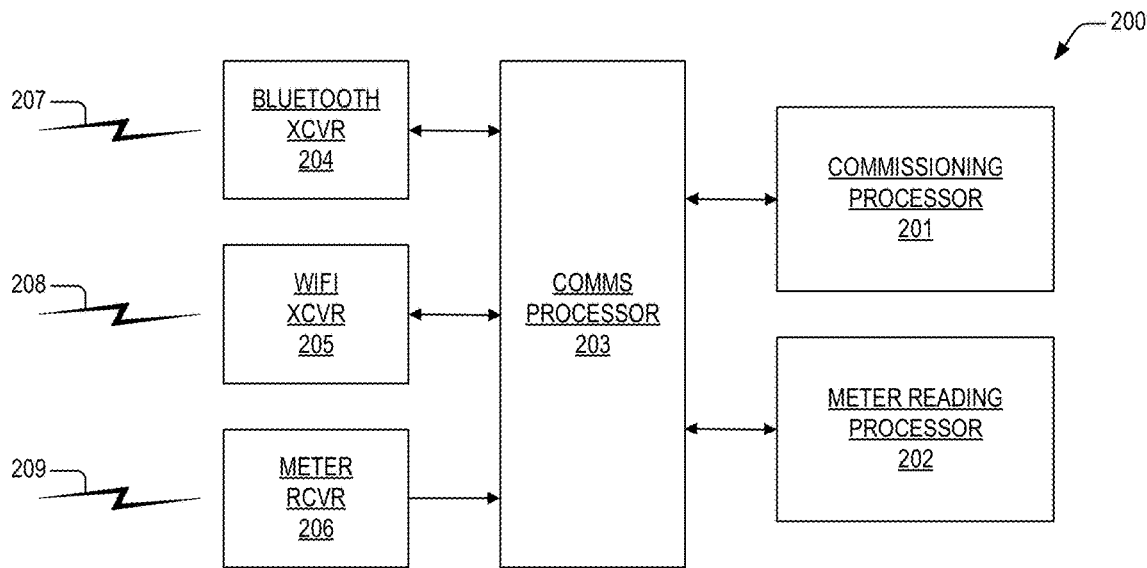
FIG. 2 is a block diagram depicting a resource monitor according to the present invention such as may be employed in the system of FIG. 1.

Now turning to FIG. 2, a block diagram is presented depicting a resource monitor 200 according to the present invention such as may be employed in the system of FIG. 1. The monitor 200 includes a commissioning processor 201 and a meter reading processor 202, both of which are coupled to a communications processor 203. The communications processor 203 is coupled to a Bluetooth transceiver 204, a WIFI transceiver 205 and a meter receiver 206. The resource monitor 200 may be powered by an AC mains power source (not shown). Another embodiment contemplates power provided by a 3.3-volt power source (not shown) that may be shared with other circuits when the resource monitor 200 is disposed in another device (e.g., modem, digital assistant, etc.).

In operation, the Bluetooth transceiver 204 transmits and receives messages according to the Bluetooth protocol over a Bluetooth wireless link 207. The WIFI transceiver 205 transmits and receives messages according to the IEEE 802.11 wireless protocol over a WIFI wireless link 208. The meter receiver 206 receives signals from meters within range over a radio link 209. According to deployment configuration, the meter receiver 206 comprises a tunable narrow band receiver that is configured to receive signals according to a combination of the following fixed frequency and frequency hopping protocols: Zig Bee SEP 1.0, Zig Bee 1.1b, Zig Bee 1.2, AMR ERT SCM tone wake, AMR ERT SCM low power, AMR ERT SCM high power, AMR ERT SCMP, and AMR ERT IDM, Cellnet, Kamstrup Wireless M-Bus, Sensus FlexNet FSK7, and Neptune R900. Additional protocols are contemplated. In an embodiment where the resource monitor 200 is embedded within another device (e.g., modem, etc.), Bluetooth and/or WIFI message processing may be shared.

As is noted above with reference to FIG. 1, the resource monitor 200 may initially establish a Bluetooth connection over the Bluetooth wireless link 207 with a client device 102, whereby the client device 102 transmits WIFI credentials messages that are received by the Bluetooth transceiver 204 and are processed by the communications processor 203. Data from the messages is provided to the commissioning processor 201. In turn, the commissioning processor 201 directs the communications processor 203 to establish a WIFI connection over the WIFI link 208, thus commissioning the resource monitor onto a user's WIFI network.

Once commissioned, the commissioning processor 201 may direct that messages be transmitted and received over the WIFI link 208 to establish communications with the resource server 130 over the internet cloud 110, and to subsequently provide registration data to register the resource monitor 200 with the system 100. Following registration, as will be describe in more detail below, the commissioning processor 201 may direct the meter receiver 206 to scan narrow band channels over the radio link 209 in order to detect meters 107 that are within reception range. In one embodiment, the commissioning processor 152 within the resource server 130 may provide instructions to the commissioning processor 201 within the resource monitor to expedite discovery of the meters 107. One embodiment contemplates discovery of approximately 10 adjacent meters 107. Once the meters are discovered, the commissioning processor 201 passes meter IDs, meter reading values, and meter protocols corresponding to the adjacent meters to the resource server 130. The commissioning processor 152 in the server 130 creates records in the resource database 151 for the meters 107 and correlates the meter IDs to user registration records. The commission processor 152 may direct that the resource monitor 200 listen for transmissions to a subset of the discovered meters 107. Once the resource monitor 200 is commissioned and paired with adjacent meters, the commissioning processors 152, 201 turn control over to the meter reading processors 153, 202.

The meter reading processor 202 directs the meter receiver 206 to periodically scan for radio signals over the radio link 209 for meters 107 to which the resource monitor 200 is paired. In one embodiment, a 30-second period is time shared between reception of meter readings from the meters 107 along with additional background signal discovery. The meter reading processor 202 may then direct the communications processor 203 to transmit messages over the WIFI link 208 that provide the acquired meter readings to the meter reading processor 153 within the server 130. The readings are then recorded in the resource database 151.

The resource monitor 200 according to the present invention may comprise one or more application programs disposed in a non-transitory memory that are executed by a CPU to perform the operations and functions described above.

Figure 3:
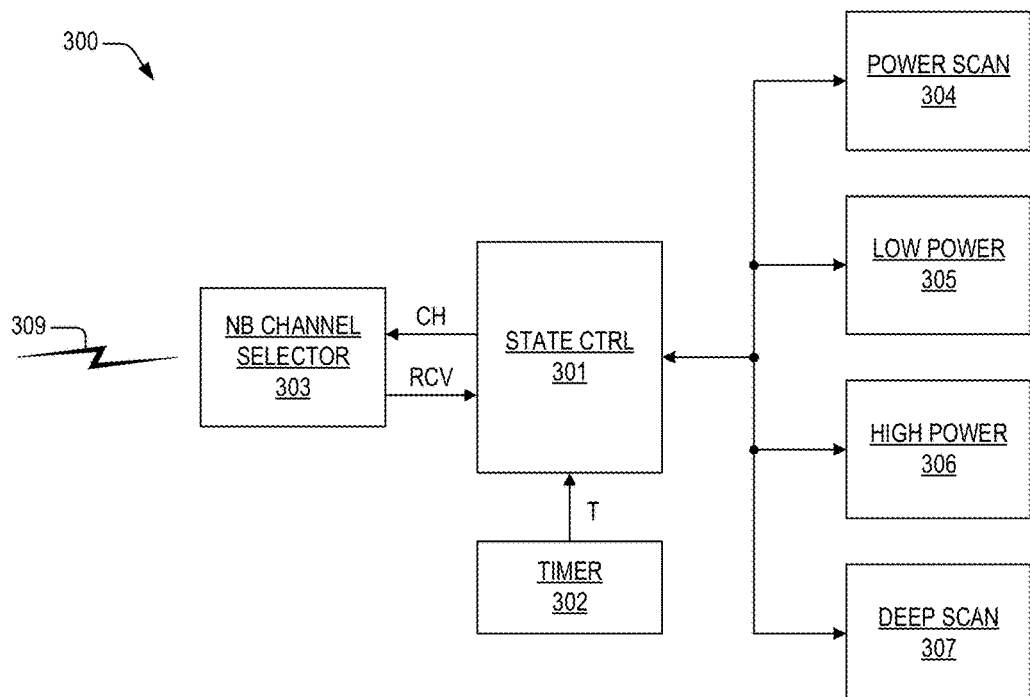
FIG. 3 is a block diagram featuring a meter receiver according to the present invention such as may be employed in the resource monitor of FIG. 2.

Referring now to FIG. 3, a block diagram is presented featuring a meter receiver 300 according to the present invention such as may be employed in the resource monitor 200 of FIG. 2. The receiver 300 may comprise power scan logic 304, low power logic 305, high power logic 306, and deep scan logic 307, all of which are coupled to a state controller 301. The receiver 300 may also comprise a timer 302 that is coupled to the state controller 301. The state controller 301 is coupled to a narrow band channel selector 303 via a channel select bus CH and a receive bus RCV.

In operation, the state controller 301 operates to control channel selection and reception of signals over a radio link 309 by causing the channel selector 303 to change RF channels according to the meter protocols described above. Channels are assigned to processing by the scan elements 304-307 according to the type of scan that is required to obtain reading from paired meters 107. The timer 302 is employed to periodically change state of the receiver 300 to share reception of signals between the scan elements 304-307, as will be described in more detail with reference to FIG. 6. In one embodiment, the timer 302 causes the receiver 300 to change state at least every 30 seconds. In one embodiment, machine learning algorithms are employed to simultaneously determine meter transmission behavior and prioritize data streams so that many meters can be supported, with an optimal data rate, on a single receiver 300.

The meter receiver 300 according to the present invention may comprise one or more application programs disposed in a non-transitory memory that are executed by a CPU to perform the operations and functions described above. The CPU and memory may be shared with other elements of the resource monitor 200.

Figure 4:
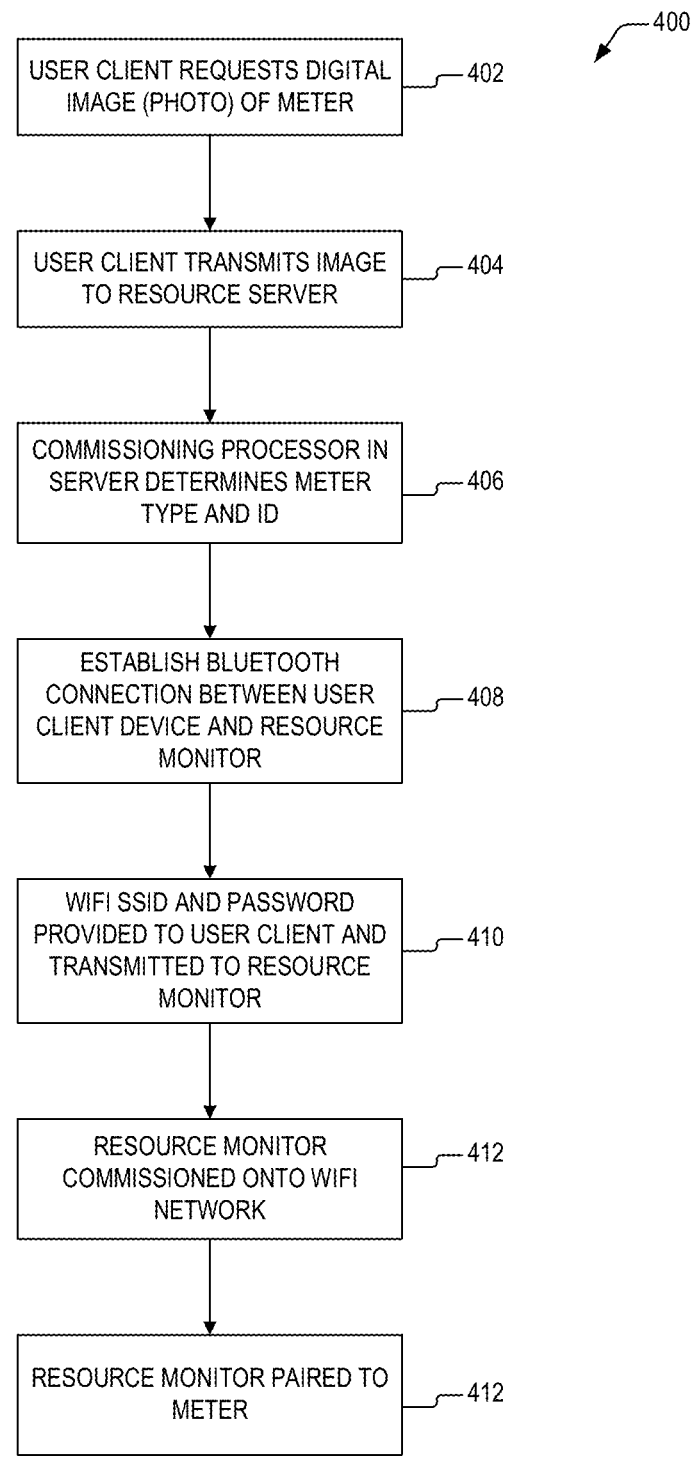
FIG. 4 is a flow diagram showing a method according to the present invention for commissioning and pairing of a resource monitor to a meter.

Turning now to FIG. 4, a flow diagram 400 is presented showing a method according to the present invention for commissioning and pairing of a resource monitor to a meter. Flow begins at block 402 where a user client application 105 executing on a user device 102 requests that a user take and submit a digital image of a meter 107 to be monitored. Flow then proceeds to block 404.

At block 404, the user client 105 causes the image of the meter 107 to be transmitted to the resource server 140. Flow then proceeds to block 406.

At block 406, the commissioning processor 152 determines the meter type and meter ID of the meter 107 in the manner described above with reference to FIG. 1. Flow then proceeds to block 408.

At block 408, the resource monitor 103 establishes a Bluetooth connection with the client device 102. Flow then proceeds to block 410.

At block 410, the client application 105 obtains WIFI network credentials from the user and transmits these credentials to the resource monitor 103. Flow then proceeds to block 412.

At block 412, the resource monitor 103 provides these credentials to a WIFI access point over the WIFI network and is thus commissioned onto the network. Flow then proceeds to block 414.

At block 412, the resource monitor 103 may perform scanning for radio signals from the meter 107 of block 402 along with adjacent meters 107 as directed by the commissioning processor 152. In turn, the commissioning processor 152 may pair the resource processor 102 to all of the meters 107 or a subset thereof as a function of received signal strength indications from the resource monitor 103 and adjacent resource monitors 103.

Figure 5:
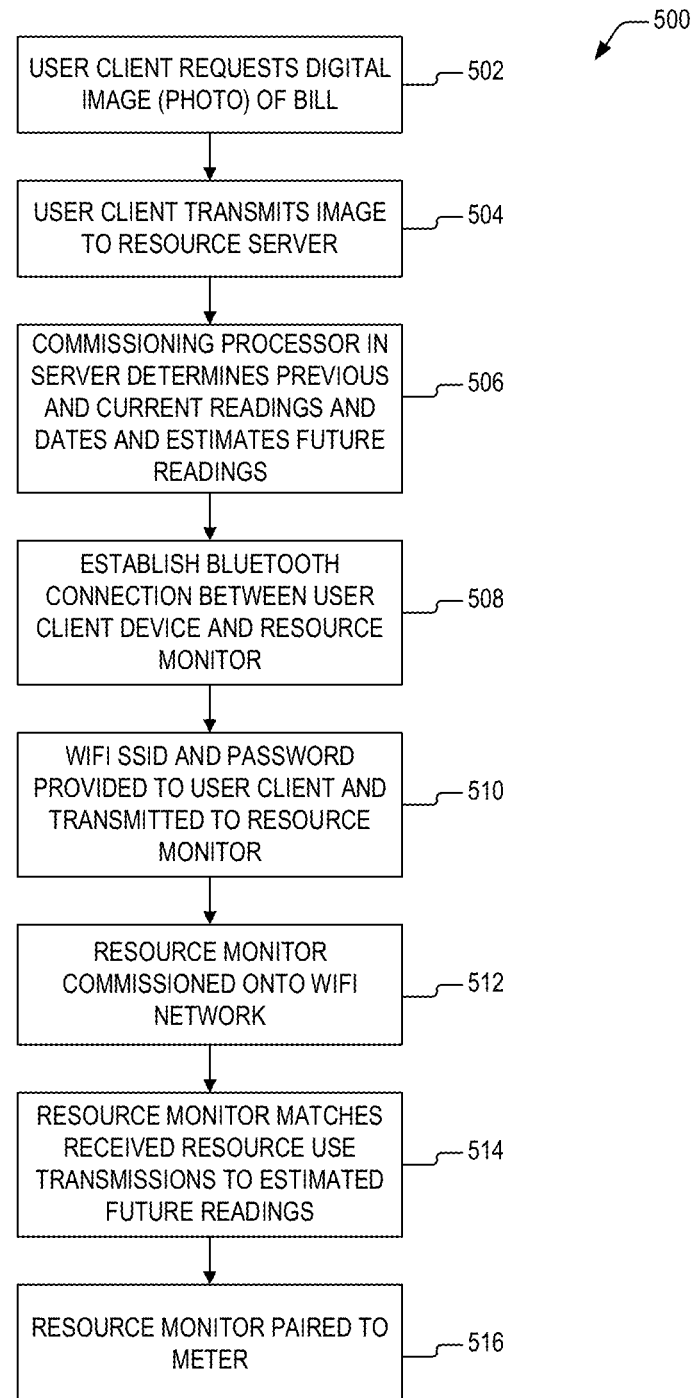
FIG. 5 is a flow diagram illustrating an alternative method according to the present invention for commissioning and pairing of a resource monitor to a meter.

Referring to FIG. 5, a flow diagram 500 is presented illustrating an alternative method according to the present invention for commissioning and pairing of a resource monitor to a meter. Flow begins at block 502 where a user client application 105 executing on a user device 102 requests that a user take and submit a digital image of current utility bill corresponding to a meter 107 to be monitored. Flow then proceeds to block 504.

At block 504, the user client 105 causes the image of the current utility bill to be transmitted to the resource server 140. Flow then proceeds to block 506.

At block 506, the commissioning processor 152 determines the meter's current and previous readings along with their corresponding dates as is described above with reference to FIG. 1. Next, the commissioning processor 152 generates a current estimated consumption reading for the meter 107 and may direct the resource monitor 103 to search for a meter 107 having a current reading that is approximately equal to the estimated consumption reading. Flow then proceeds to block 508.

At block 508, the resource monitor 103 establishes a Bluetooth connection with the client device 102. Flow then proceeds to block 510.

At block 510, the client application 105 obtains WIFI network credentials from the user and transmits these credentials to the resource monitor 103. Flow then proceeds to block 512.

At block 512, the resource monitor 103 provides these credentials to a WIFI access point over the WIFI network and is thus commissioned onto the network. Flow then proceeds to block 514.

At block 514, the resource monitor 103 may continue scanning for radio signals from the meter 107 of block 402 along with scanning for radio signals from adjacent meters 107 as directed by the commissioning processor 152. In turn, the commissioning processor 152 may pair the resource processor 102 to all of the meters 107 or a subset thereof as a function of received signal strength indications from the resource monitor 103 and adjacent resource monitors 103.

Figure 6:
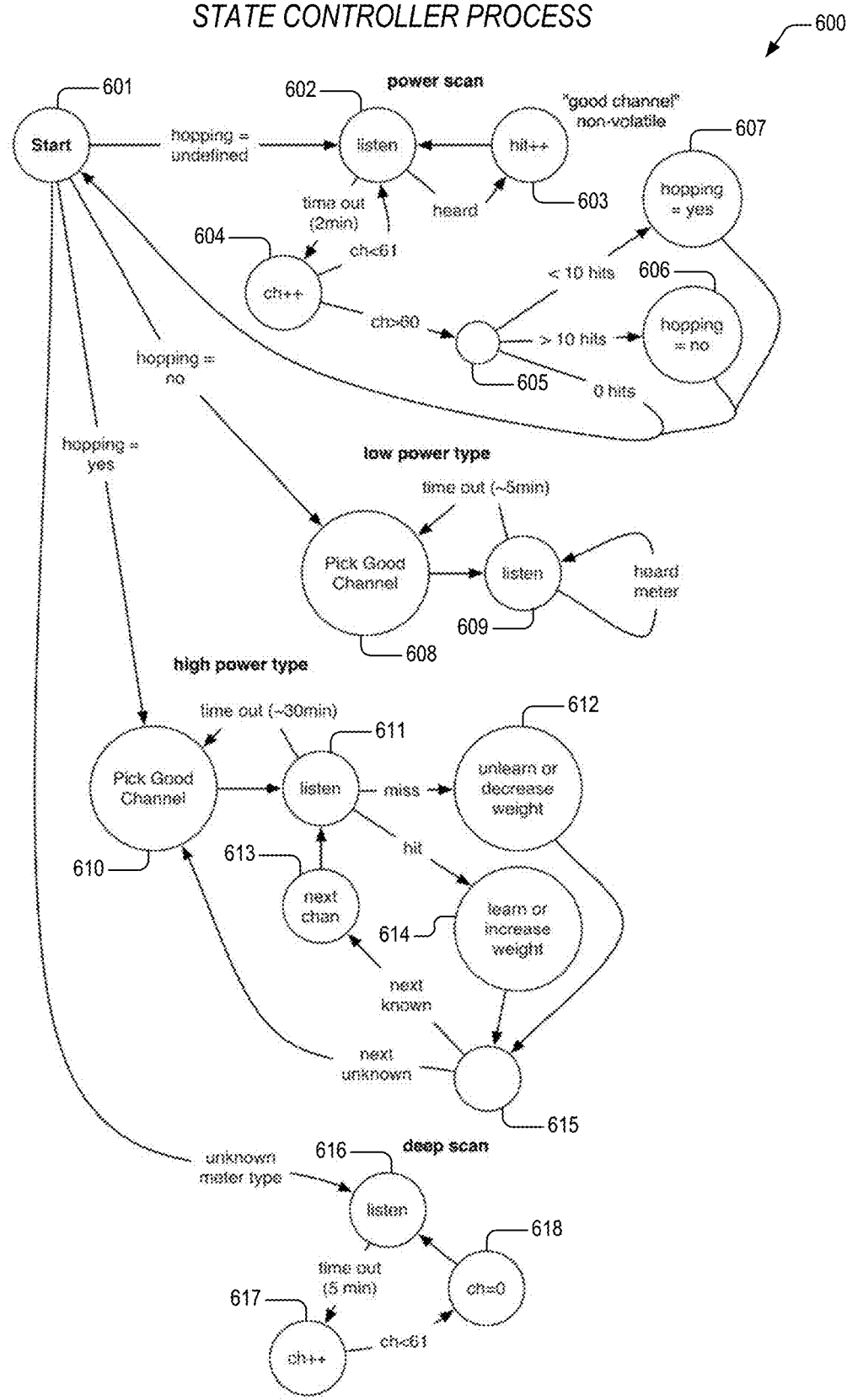
FIG. 6 is a diagram detailing states of the state controller of FIG. 3.

Turning to FIG. 6, a diagram 600 is presented detailing states of the state controller 300 of FIG. 3. The diagram 600 depicts scan states associated with like named scanning elements 304-307 within the meter receiver 300, which are power scan states, low power type scan states, high power type scan states, and deep scan states. Though the diagram 600 depicts scanning of 60 channels, which is consistent with 902-928 MHz ISM bands, the present inventors note that channel numbers may be configured based upon meter radio types. In the case of a Zigbee radio, there are only 16 channels.

At a summary level, the timer 302 guides the state controller 301 between radio discovery and receiving modes. The power scan logic 304 handles the initial discovery process when the receiver 300 is first set out to learn a new meter's hopping sequence. The low power logic 305 handles receiving data from non-hopping (i.e., fixed frequency) low-power meter types 107. The low power logic 305 also accounts for interference with other low-power meters 107 in the area by providing frequency agility through alternate RF channel selections. The high power logic 305 handles receiving high resolution data from meters 107 that frequency hop. The deep scan logic 307 handles all other meters by providing best effort scanning and listening across all channels. At state 601, scanning proceeds to the power scan states 602-607

As detailed in power scan states 602-607, the receiver 300 first performs a scan of all available channels in the frequency band. This allows it to verify that a meter transmitter is within range and to determine if the transmitter is of a low power variant or high power variant. When the receiver 300 is initialized, a Boolean variable HOPPING is set to undefined. The receiver 300 then listens on a first channel. If the desired meter ID is heard, then an integer variable HIT is incremented. When the timer 302 indicates that a 2-minute timeout has occurred, a channel variable CH is incremented and the timer 302 is reset. This state process continues until all 60 channels are scanned. Following this, HIT is evaluated. If HIT is greater than 10, then HOPPING is set to FALSE (i.e., the meter 107 is of the low power type). If HIT is greater than 0 and less than 10 then HOPPING is set to TRUE (i.e., the meter 107 is of the high power type). If HIT is equal to 0, the searched for meter 107 has not been detected. In one embodiment, a notification is pushed to the client device 102 requesting the user to move the resource monitor 103 to an outlet that is closer to the meter 107.

If the meter 107 is not found to be of a channel hopping type, then the receiver 300 enters low power states 608-609. An initial channel is chosen from the highest received signal strength indicator (RSSI) measured during the power scan states 602-606. If the receiver 300 does not detect transmissions from the desired meter 107 within a 5-minute timeout, then an alternate channel is chosen. The alternate channel is selected randomly from the set of channels that had previously received the desired meter ID with a strong RSSI observed during the power scan states 602-606.

If the transmitter is found to be of a channel hopping type, then the receiver 300 enters a high power mode and begins learning the meter's hopping sequence as depicted by states 610-615. In a typical high power mode, every 30 seconds an N-channel slot register (not shown) with a current estimate of channel hopping sequence for the meter is rotated to the left and the leftmost entry is wrapped back to the rightmost entry. If the current channel is not known, then a channel guess is selected from a candidate channel list. If the meter 107 is heard on a channel corresponding to the channel guess, then that entry in the slot register is given a weight. The next time that channel comes around in the sequence and is heard from again, then that weight is incremented. Channels having a weight of 10 are considered as known and are stored within the receiver 300 for subsequent reading of the meter 107. If the meter 107 was not heard from on a current channel, then the weight value is decremented. Channels weight values of zero are considered as aberrations, they are dropped from the listening sequence channel, and are replaced by a new channel guess. Other embodiments contemplate the employment of 2-, 4-, 7-, 9-, 15-, and 60-second slots.

Advantageously, the weighting according to the present invention provides for an indication of confidence with learned sequences given well-known variabilities in transmitter clocks, receiver clocks, and timing jitter.

In the deep scan states 616-618, the receiver 300 listens on all of the available channels for a period of 5 minutes each, thus providing a technique to discover a meter 107 that is neither a low-power meter or a high-power meter.

Figure 7:
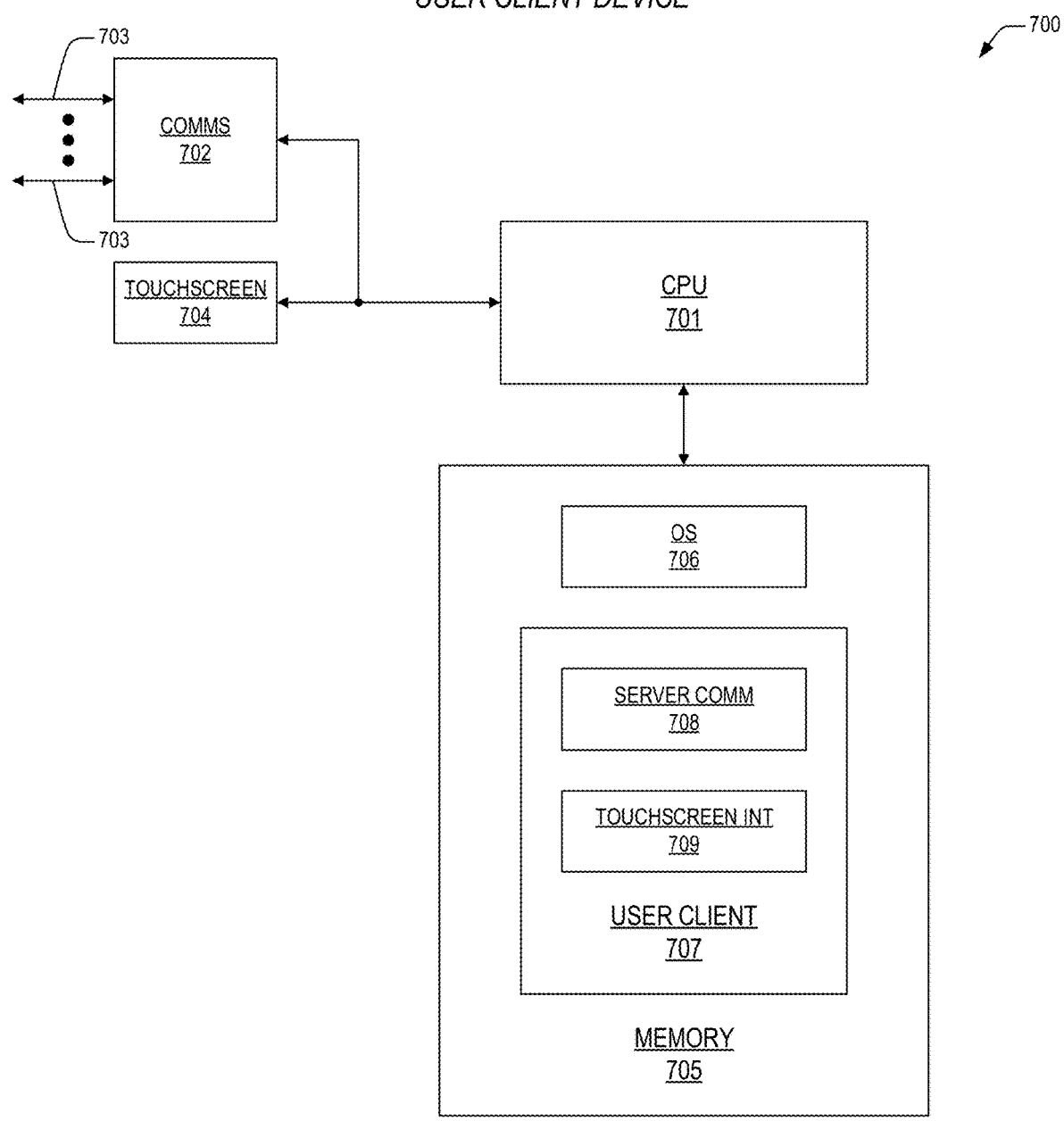
FIG. 7 is a block diagram detailing a user client device according to the present invention.

Now referring to FIG. 7, a block diagram is presented detailing a user client device 700 according to the present invention, such as the client device 102 of FIG. 1. The client device 700 may include a central processing unit (CPU) 701 that is coupled to memory 705 having both transitory and non-transitory memory components therein. The CPU 701 is also coupled to a communications circuit 702 that couples the client device 700 to internet cloud 110 via one or more wired and/or wireless links 703. The links 703 may include, but are not limited to, Ethernet, cable, fiber optic, and digital subscriber line (DSL). The client device 700 may also comprise a touchscreen 704 that is coupled to the CPU 701.

The memory 705 may include an operating system 1106 such as, but not limited to, Microsoft Windows, Mac OS, Unix, Linux, iOS, and Android OS, where the operating system 706 is configured to manage execution by the CPU 701 of program instructions that are components of a user client application program 707. In one embodiment, the user client application program 707 comprises a server communications code segment SERVER COMM 708 and a touchscreen interface code segment TOUCHSCREEN INT 709.

When executing on the client device 700, the user client 707 provides for display of information provided by the resource server 130 related to commissioning of resource monitors 103 and engagement notifications as described above that enable a user to pair their meter 107 with a resource monitor 103. The SERVER COMM 708 segment may execute to receive this information and the touchscreen interface segment 709 may execute to transmit this information to the touchscreen 704. Likewise, the user client 707 provides for input of WIFI credentials and other user registration information provided by the user via the touchscreen 704 for transmission to the resource server 130. The SERVER COMM 708 segment may execute to transmit this information and the touchscreen segment 708 may execute to receive this information to from the touchscreen.

Now turning to FIG. 8, a block diagram is presented detailing a resource server 800 according to the present invention, such as the resource server 130 of FIG. 1. The resource server 800 may include one or more central processing units (CPU) 801 that are coupled to memory 806 having both transitory and non-transitory memory components therein. The CPU(s) 801 are also coupled to a communications circuit 802 that couples the resource server 800 to the internet cloud 110 via one or more wired and/or wireless links 803. The links 1080303 may include, but are not limited to, Ethernet, cable, fiber optic, and digital subscriber line (DSL). As part of the network path to and through the cloud 110, providers of internet connectivity (e.g., ISPs) may employ wireless technologies from point to point as well.

The resource server 800 may also comprise input/output circuits 804 that include, but are not limited to, data entry and display devices (e.g., keyboards, monitors, touchpads, etc.). The memory 806 may be coupled to a resource database 805 as described above. Though the memory 806 is shown directly coupled to the resource database 805, the present inventors note that interfaces to this data source may exclusively be through the communications circuit 802.

The memory 806 may include an operating system 807 such as, but not limited to, Microsoft Windows, Mac OS, Unix, and Linux, where the operating system 807 is configured to manage execution by the CPU(s) 801 of program instructions that are components of one or more application programs. In one embodiment, a single application program comprises a plurality of code segments 808-816 resident in the memory 806 and which are identified as a configuration code segment CONFIG 808, a client communications code segment CLIENT COMM 809, a presentation processor code segment PRESENTATION PROC 810, a utility web services code segment UTILITY WEB SERV 811, a commissioning processor code segment COMMISSIONING PROC 812, a meter reading processor code segment METER READING PROC 813, a disaggregation processor code segment DISAGG PROC 814, a outage detection processor code segment OUTAGE DET PROC 815, and an engagement processor code segment ENGAGEMENT PROC 1016.

Operationally, the resource server 800 may execute one or more of the code segments 808-816 under control of the OS 807 as required to enable the resource server 800 to perform the commissioning, pairing, meter reading, disaggregation, outage detection, and engagement functions as have been described above. The COMMS 802 is employed to transmit and receive messages from commissioned resource monitors 103 and from utility providers that access services through their respective utility web browsers 104, where UTILITY WEB SERV 811 provides for formatting and transmission of various displays that may be employed and for capture of engagement messages for users, thresholds for outage detection, demand management information, and the like.

CONFIG 808 may be executed to place the server 800 into an operational or maintenance mode, where the maintenance mode may be entered to allow for data from the data sources such as weather history and forecasts, data from utilities that correspond to their deployed resource monitors 103, and the like, where the data may be entered via automated or manual means. CLIENT COMM 809 may be executed to perfect reliable transfer of information between the resource server 1000 and client applications 195 executing on respective client devices 102. PRESENTATION PROC 810 may be executed to format and provide notifications to client applications 105 executing on respective client devices 102 as is described above.

COMMISSIONING PROC 812 may be executed to perform any of the functions and operations described above with reference to the commissioning processor 152 of FIG. 1. METER READING PROC 813 may be executed to perform any of the functions and operations described above with reference to the meter reading processor 153 of FIG. 1. DISAGG PROC 814 may be executed to perform any of the functions and operations described above with reference to the disaggregation processor 154 of FIG. 1 and which will be described in more detail with reference to FIG. 9. OUTAGE DET PROC 815 may be executed to perform any of the functions and operations described above with reference to the outage detection processor 155 of FIG. 1 and which will be described in more detail below with reference to FIGS. 10-11. And ENGAGEMENT PROC 1016 may be executed to perform any of the functions and operations described above with reference to the engagement processor 156 of FIG. 1.

Figure 9:
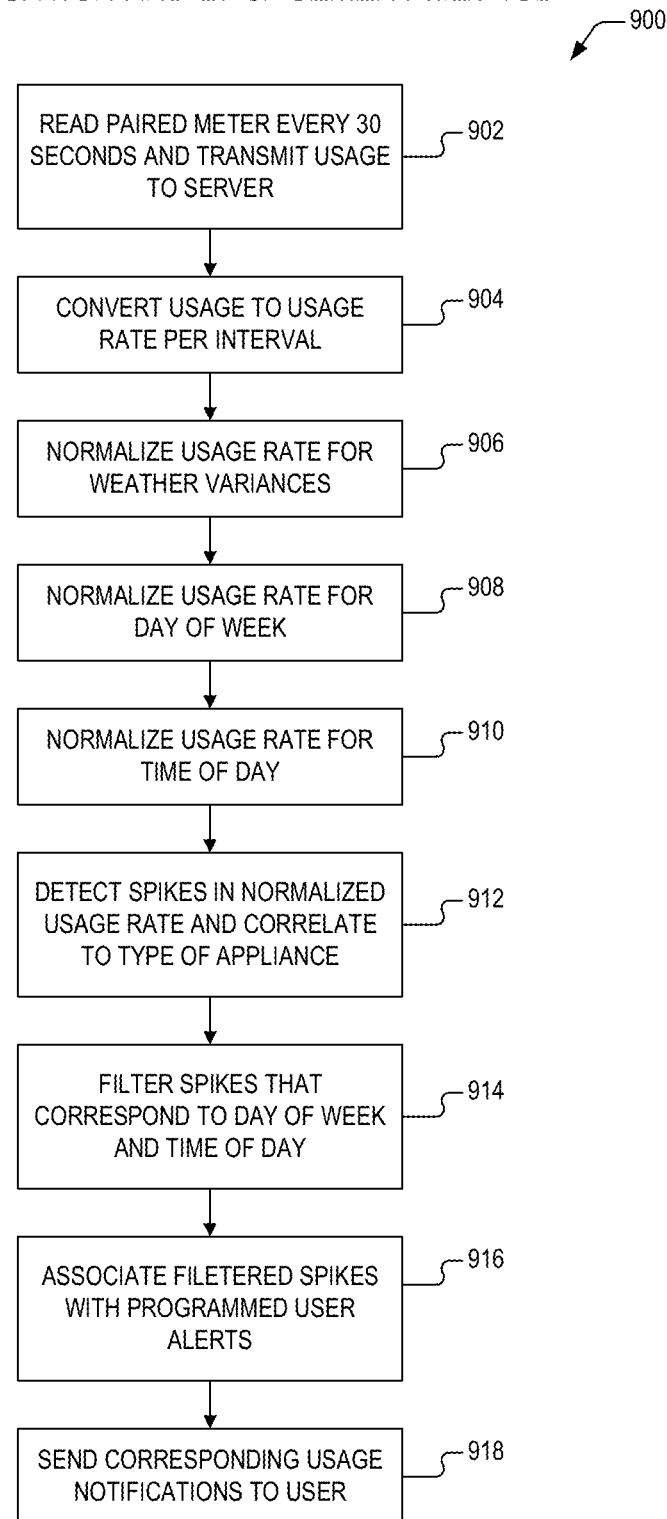
FIG. 9 is a flow diagram detailing a method according to the present invention for disaggregation of usage rate spikes and customer engagement.

Referring now to FIG. 9, a flow diagram 900 is presented detailing a method according to the present invention for disaggregation of usage rate spikes and customer engagement, such as may be performed by the disaggregation processor 154 and engagement processor 156 of FIG. 1. Flow begins at block 902 where resource monitors 103 that are paired to a meter 107 listen to transmissions from the meter 107 to determine current usage readings. These usage readings from the meter 107 are then transmitted to the resource server 130 every 30 seconds and corresponding records within the resource database 151 are updated. Flow then proceeds to block 904.

At block 904, the disaggregation processor 154 accesses usages readings along with corresponding timestamps for a prescribed period of time. In one embodiment, the prescribed period is one month. Another embodiment contemplates a period of one year. Using the timestamps, the disaggregation processor 154 then converts the usage readings to usage rates for specified intervals, where the specified intervals may comprise 2-minute intervals, 5-minute intervals, or 30-minute intervals. For example, the aggregation processor 154 may convert consumption of 5 kWh of electricity over a period of 30 minutes from 14:30 to 15:00 to an average power of 10 kW during that 30-minute period. Flow then proceeds to block 906.

At block 906, the disaggregation processor 154 normalizes the usage rates determined in block 904 for weather variances by employing historical weather data to remove the effects of weather upon usage rates. Flow then proceeds to block 908.

At block 908, the usage rates generated at block 906 are then normalized based upon day of the week by statistically binning daily usage rates for like historical days and determining a normalized daily usage rate that is the expected value plus or minus one standard deviation of all the usage rates generated at block 906. Flow then proceeds to block 910.

At block 910, the usage rates generated at block 906 are then normalized based upon time of day by statistically binning time-of-day usage rates as is discussed above with reference to FIG. 1. Flow then proceeds to block 912.

At block 912, the disaggregation processor 154 analyzes normalized usage rates as is discussed above to identify spikes in usage and further correlates spikes in usage to type of appliance (e.g. oven, washer, compressor, furnace, etc.). Flow then proceeds to block 914.

At block 914, the disaggregation processor 154 filters out normal usage spikes as is discussed above based upon time of day, day of week, and user usage category. Flow then proceeds to block 916.

At block 916, unusual usage spikes that have not been filtered out at block 914 are provided to the engagement processor 156, which associates these spikes with alerts that are programmed by resource providers through their web portal 104. Flow then proceeds to block 918.

At block 918, the engagement processor 156 may cause alerts to be transmitted to corresponding users that include content prescribed by the resource providers. The alerts may comprise push notifications, SMS messages, emails, and/or recorded voice messages.

Figure 10:
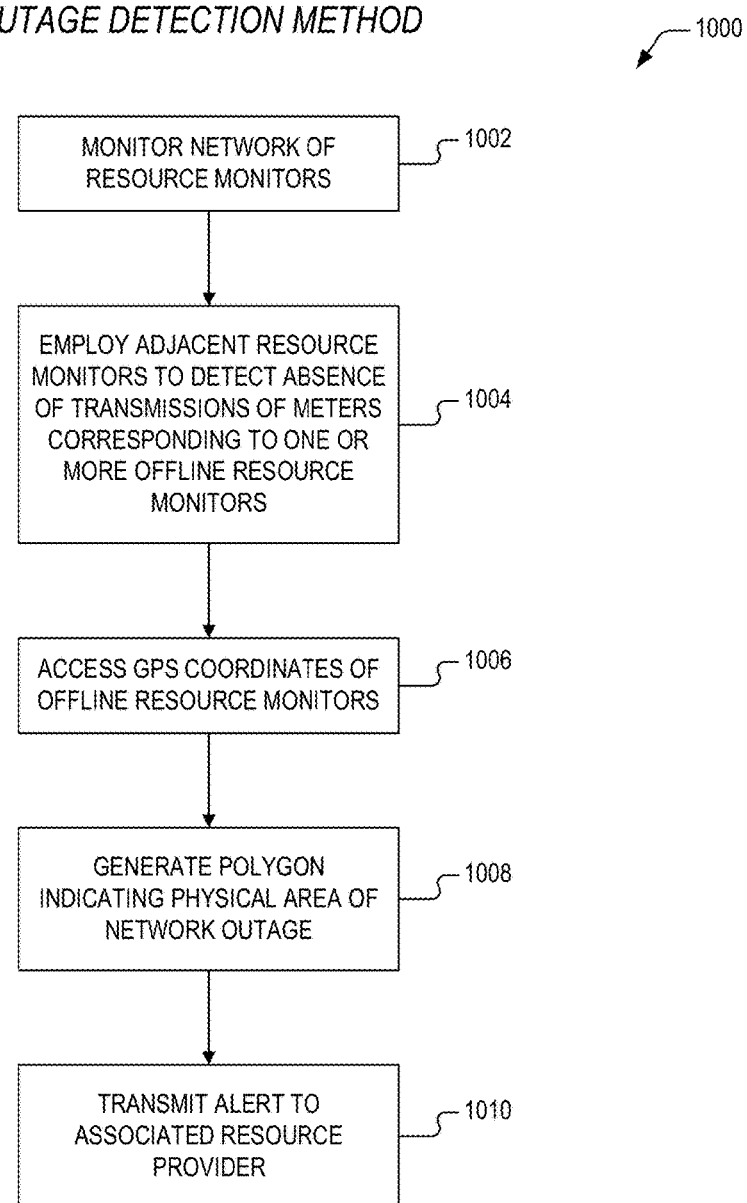
FIG. 10 is a flow diagram illustrating a method according to the present invention for detection and notification of resource outages.
Figure 11:
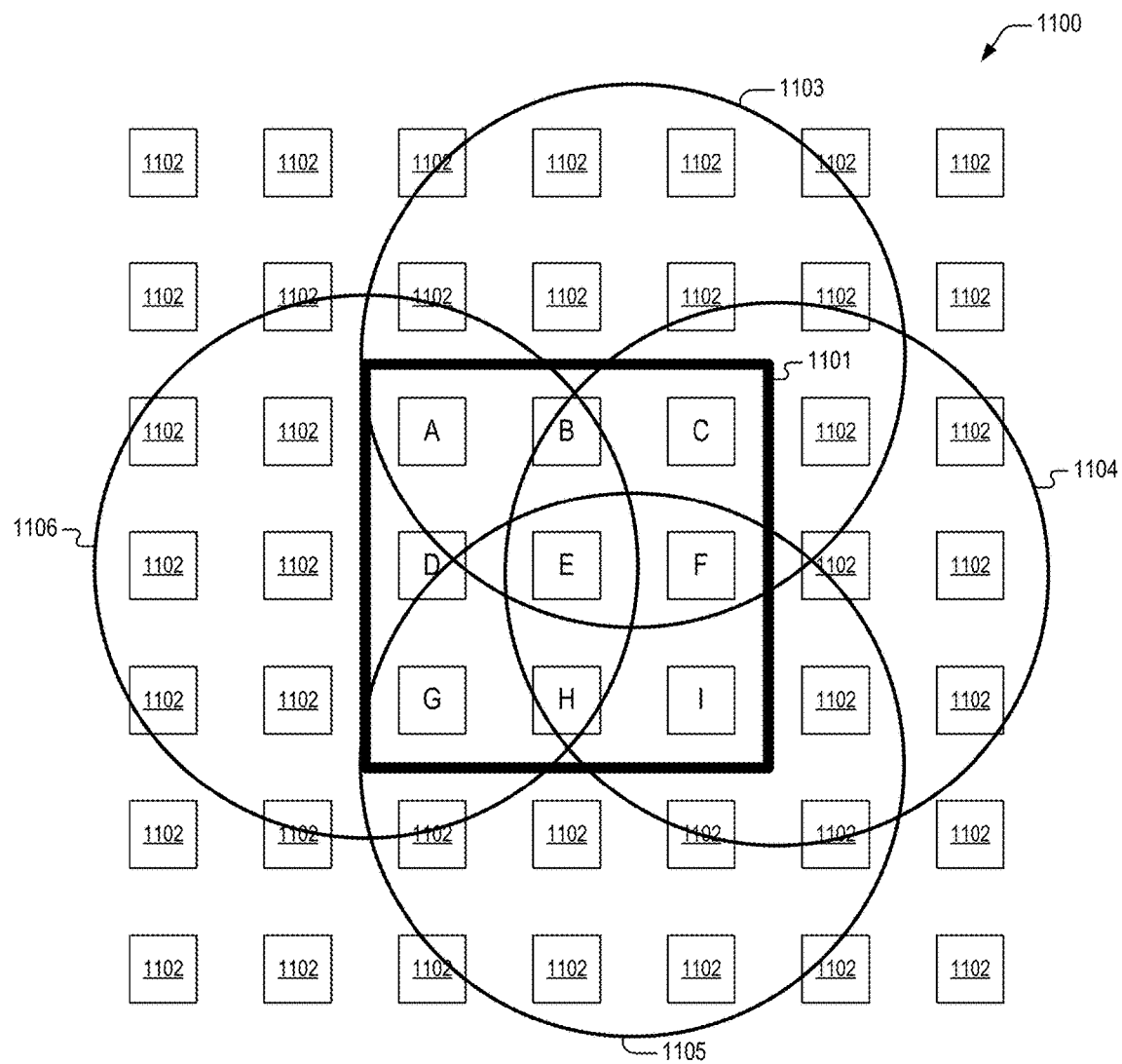
FIG. 11 is a diagram depicting an exemplary network of resource monitors, their coverage, and determination of a physical area of a resource outage.

Turning now to FIG. 10, a flow diagram 1000 is presented illustrating a method according to the present invention for detection and notification of resource outages. At a summary level, the outage detection processor 155 is configured to detect resource monitors 103 that are offline, that is, not transmitting meter readings. The physical locations (e.g., GPS coordinates) are retrieved from the resource database 151 and are employed to define a polygon on a geographic map, where the polygon represents a physical boundary to an outage area. Remote monitors 103 outside of the polygon are used to sense meters 107 inside the polygon whose corresponding remote monitors 103 are no longer reporting data. The outage detection processor 155 employs a voting technique to apply a confidence metric to the online/offline status of non-reporting monitors 103. Consider a network 1100 of paired resource monitors and meters 1102 as is shown in the diagram of FIG. 11. Paired monitor/meter A may be redundantly monitored by monitor/meters 1102 in zones 1103 and 1106. Paired monitor/meter C may be redundantly monitored by monitor/meters 1102 in zones 1103 and 1104. Paired monitor/meter I may be redundantly monitored by monitor/meters 1102 in zones 1104 and 1105. Paired monitor/meter G may be redundantly monitored by monitor/meters 1102 in zones 1105 and 1106. Paired monitor/meter B may be redundantly monitored by monitor/meters 1102 in zones 1103, 1104 and 1106. Paired monitor/meter F may be redundantly monitored by monitor/meters 1102 in zones 1103, 1104, and 1105. Paired monitor/meter H may be redundantly monitored by monitor/meters 1102 in zones 1104, 1105, and 1106. Paired monitor/meter D may be redundantly monitored by monitor/meters 1102 in zones 1103, 1105, and 1106. And paired monitor/meter E may be redundantly monitored by monitor/meters 1102 in all four zones 1103-1106.

When paired monitor/meters A-I go offline, paired monitor/meters 1102 in the four zones 1103-1106 vote negatively on the health of paired monitor/meters A-I, which are in a physical geographic region defined by polygon 1101, thus indicating a localized resource outage. When a paired meter/monitor 1102, A-I goes offline, but adjacent paired meter/monitors are able to detect transmissions, such would not indicate a resource outage, but rather a localized power outage, or a localized outage of the internet.

Flow begins at block 1002, where the outage detection processor 155 monitors a resource provider's corresponding network of resource monitors 103 to determine if they are online or offline. Flow then proceeds to block 1004.

At block 1004, adjacent resource monitors 103 are employed to detect the absence of transmissions from meters 107 corresponding to offline resource monitors 103. Flow then proceeds to block 1006.

At block 1006, the outage detection processor 156 access the resource database 151 to retrieve the GPS coordinates of each of the offline resource monitors. Flow then proceeds to block 1008.

At block 1008, the outage detection processor 156 employs the retrieved GPS coordinates to define a geographic polygon indicating a physical area of outage. The outage may be due to localized resource outage (e.g., transformer outage, substation outage) or may be due to network outage (e.g., Internet). Flow then proceeds to block 1010.

At block 1010, alerts are transmitted through the web portal 104 to the resource provider associated with the offline monitors 103 that indicate the geographic area of outage and the type of outage. Advantageously, the techniques for outage detection according to the present invention do not rely upon self-reporting of AMI meters 103 or backhaul power backup. Additional advantages include more timely reporting of outages over that provided by AMI meters 103 and inclusion of AMR meters 103 that better define localized outage areas.

Figure 12:
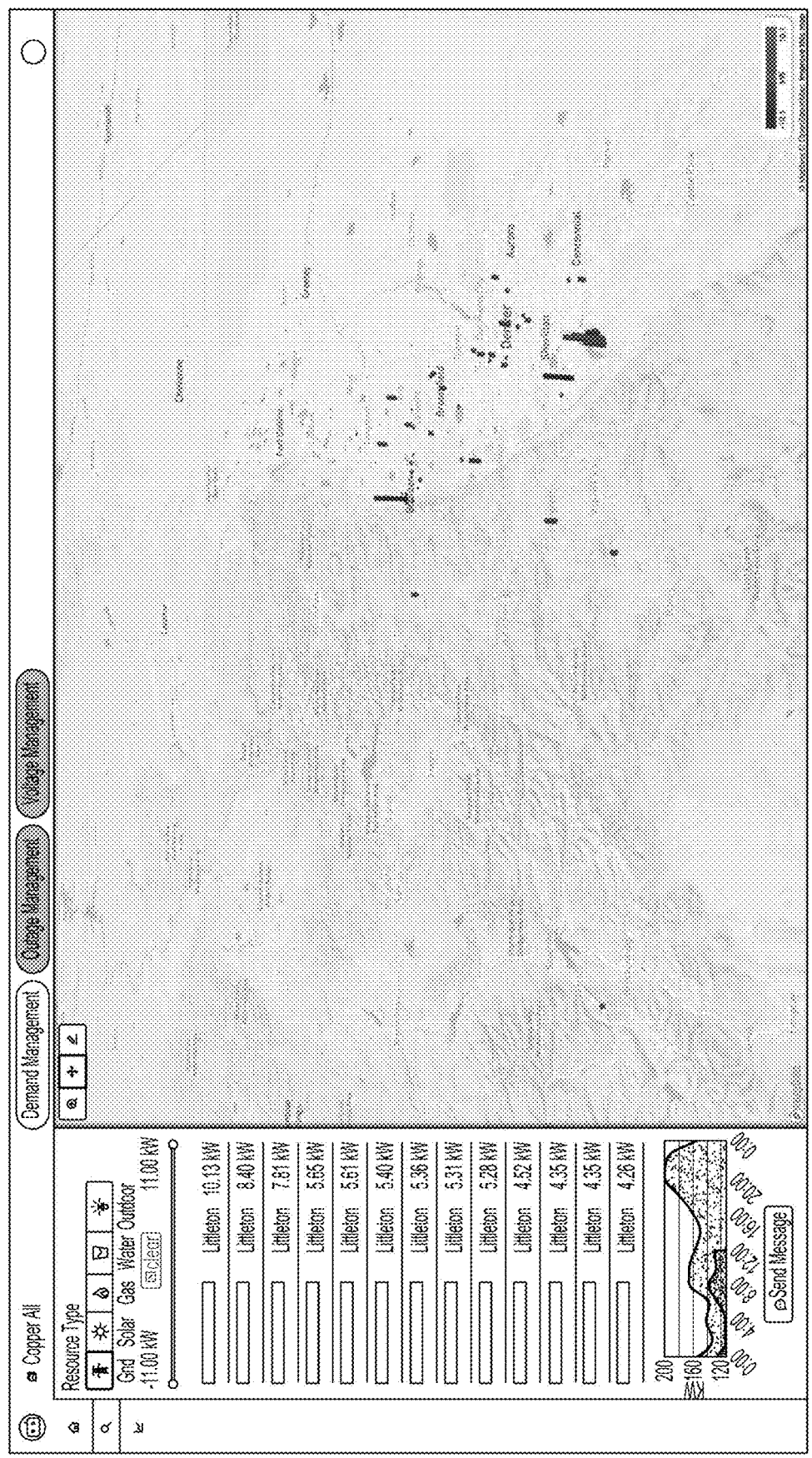
FIG. 12 is a diagram featuring an exemplary usage display according to the present invention such as might be presented by the resource server of FIG. 1 to the utility web browser 104.

FIG. 12 is a diagram featuring an exemplary usage display 1200 according to the present invention such as might be presented by the resource server of FIG. 1 to the utility web browser 104. A provider may select resource type (e.g., grid, solar, gas, water, etc.). The exemplary usage display 1200 shows that the resource provider has selected grid as a resource type. Accordingly, the selected resource type consumption is displayed on a map according to application (e.g., demand management, outage management, voltage management) along with real-time consumption.

Figure 13:
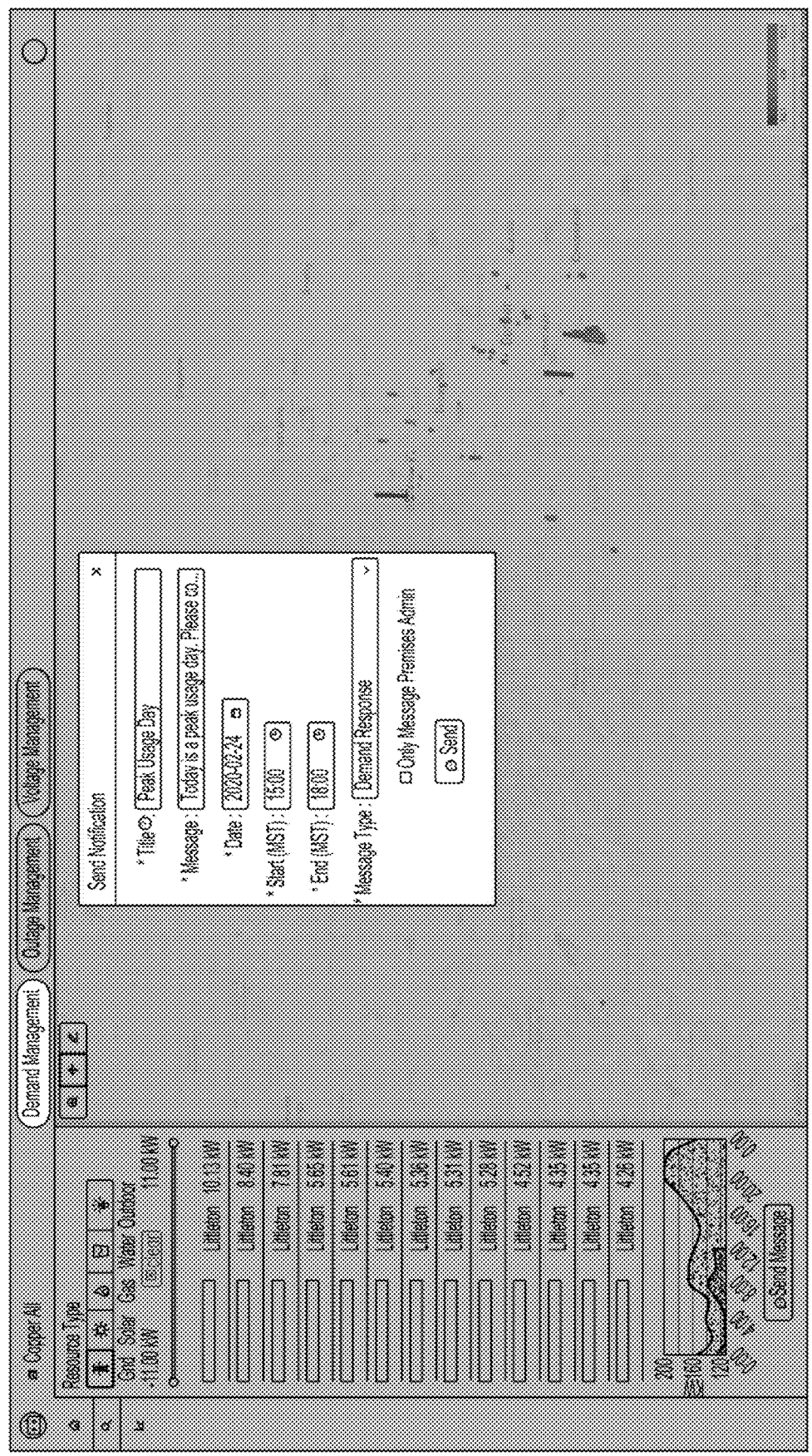
FIG. 13 is a diagram showing an exemplary notification display according to the present invention such as might be presented by the resource server of FIG. 1 to the utility web browser 104.

FIG. 13 is a diagram showing an exemplary notification display 1300 according to the present invention such as might be presented by the resource server of FIG. 1 to the utility web browser 104. In this example, the resource provider may prescribe that notifications be sent to users in a geographic area at a certain date and time. In the exemplary display, the notification corresponds to demand reduction during a peak usage day.

Figure 14:
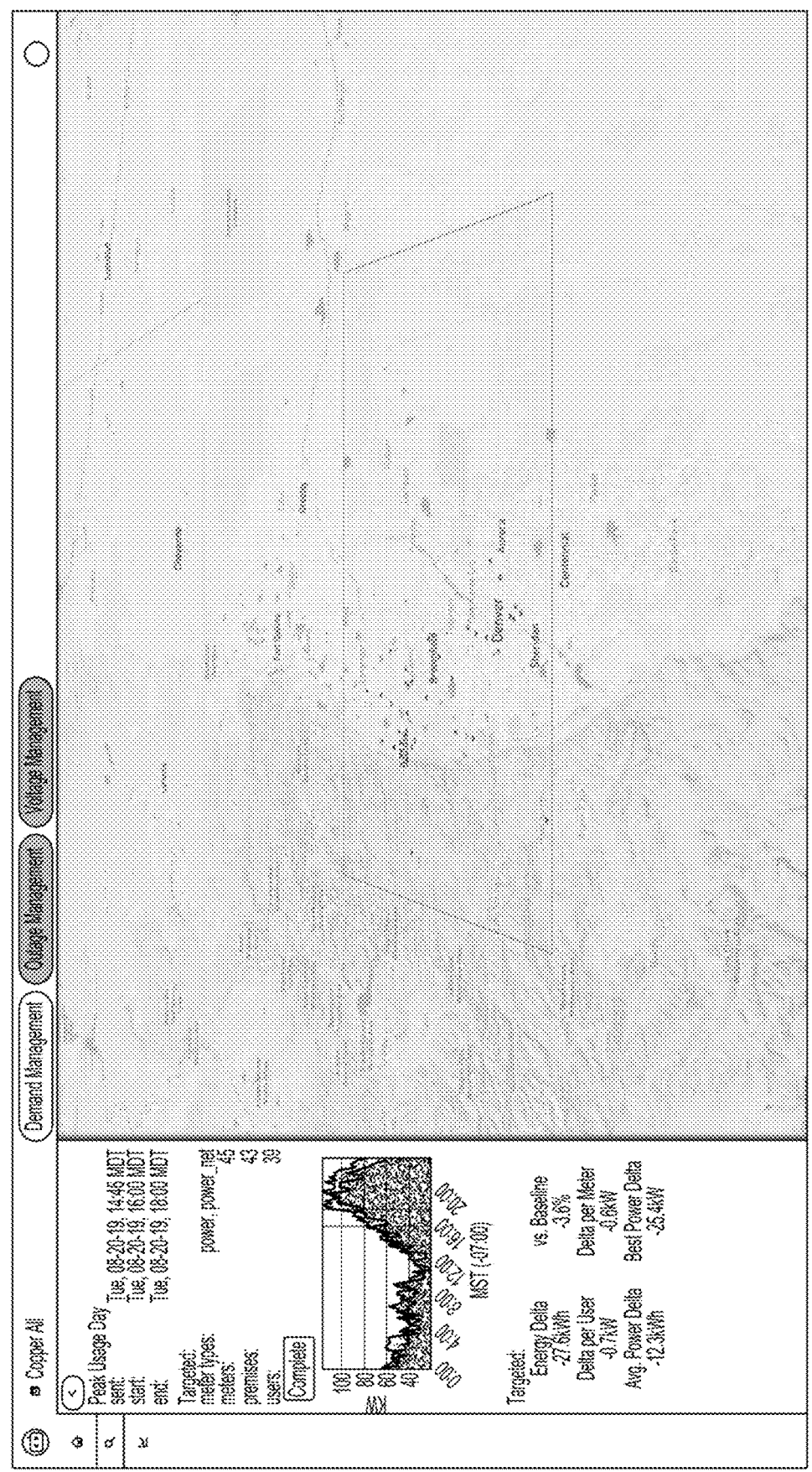
FIG. 14 is a diagram illustrating an exemplary demand management results display according to the present invention such as might be presented by the resource server of FIG. 1 to the utility web browser 104.

FIG. 14 is a diagram illustrating an exemplary demand management results display 1400 according to the present invention such as might be presented by the resource server of FIG. 1 to the utility web browser 104. In this display 1400, metrics are displayed corresponding to the start and end of a demand reduction program that was initiated by the notifications provided with reference to FIG. 13.

Figure 15:
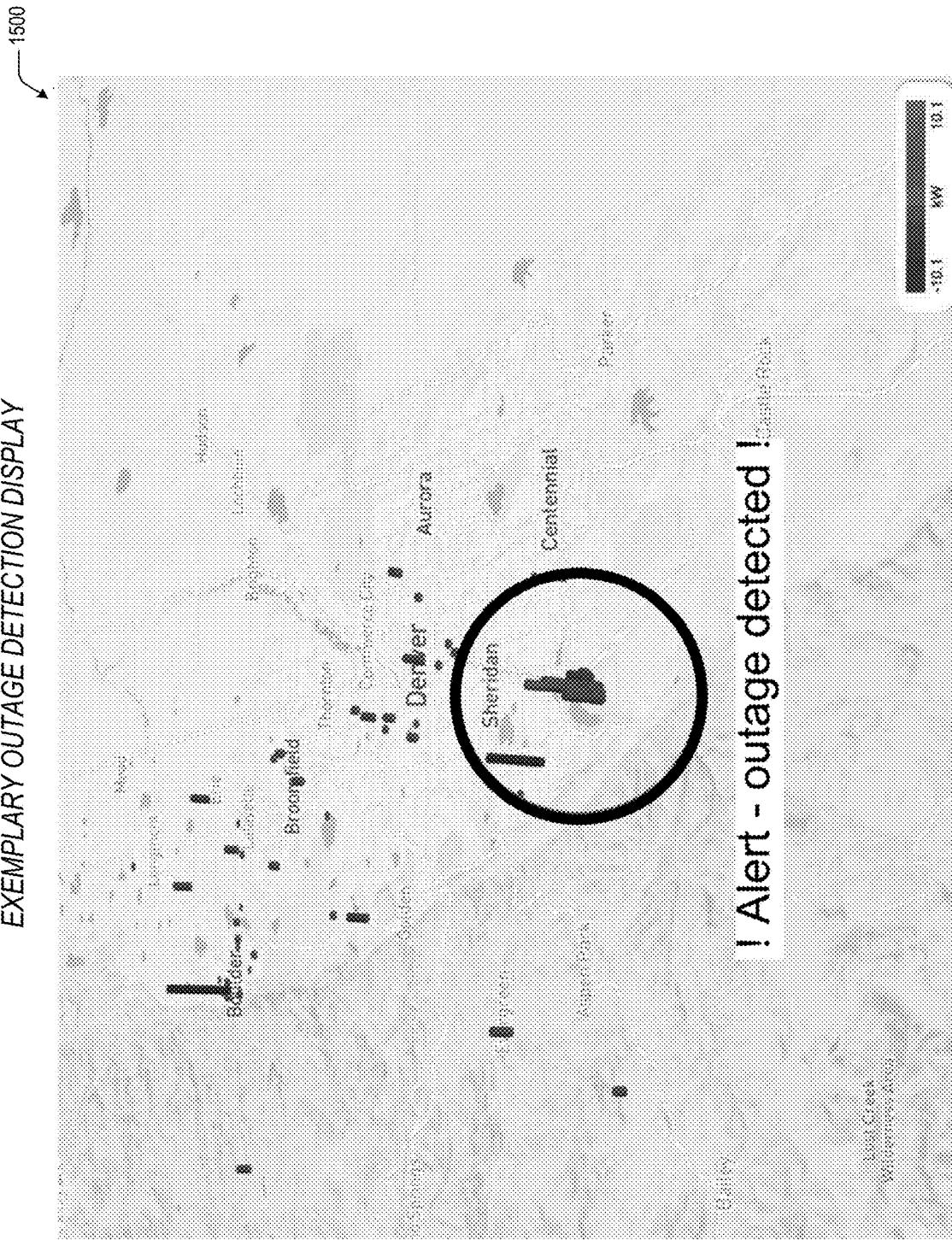
FIG. 15 is a diagram detailing an exemplary outage detection alert display according to the present invention such as might be presented by the resource server of FIG. 1 to the utility web browser 104.

Finally, FIG. 15 is a diagram detailing an exemplary outage detection alert display 1500 according to the present invention such as might be presented by the resource server of FIG. 1 to the utility web browser 104. The display 1500 shows a geographic area that corresponds to an outage determined by the outage detection processor 155 described above with reference to FIGS. 1 and 10.

Advantageously, the energy resource monitoring and engagement system 100 according to the present invention represents a substantial improvement in this field of art by providing techniques for translating near-real-time AMI meter data and AMR meter data into real-time streams of consumption, where the streams may be employed to generate timely alerts to both users and resource providers regarding consumption, outages, appliance wear, occupancy, etc. Generation of these real-time streams do not require a physical connection to a monitored resource (e.g., a current clamp inside a breaker box, a flow meter, etc.), which is a superior improvement in monitoring over that which has heretofore been provided.

Portions of the present invention and corresponding detailed description are presented in terms of software or algorithms, and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, a microprocessor, a central processing unit, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be electronic (e.g., read only memory, flash read only memory, electrically programmable read only memory), random access memory magnetic (e.g., a floppy disk or a hard drive) or optical (e.g., a compact disk read only memory, or "CD ROM"), and may be read only or random access. Similarly, the transmission medium may be metal traces, twisted wire pairs, coaxial cable, optical fiber, or some other suitable transmission medium known to the art. The invention is not limited by these aspects of any given implementation.

The particular embodiments disclosed above are illustrative only, and those skilled in the art will appreciate that they can readily use the disclosed conception and specific embodiments as a basis for designing or modifying other structures for carrying out the same purposes of the present invention, and that various changes, substitutions and alterations can be made herein without departing from the scope of the invention as set forth by the appended claims. For example, components/elements of the systems and/or apparatuses may be integrated or separated. In addition, the operation of the systems and apparatuses disclosed herein may be performed by more, fewer, or other components and the methods described may include more, fewer, or other steps. Additionally, unless otherwise specified steps may be performed in any suitable order.

Although specific advantages have been enumerated above, various embodiments may include some, none, or all of the enumerated advantages.

What is claimed is:

1. A system for instantaneous resource monitoring and engagement, the system comprising:
   a resource server, coupled to an internet cloud, that monitors use of a resource, and that engages resource users when unusual patterns of resource consumption are detected, said resource server comprising:
      a meter reading processor, configured to communicate with the resource monitors that are each disposed within corresponding radio ranges of corresponding one or more resource meters, wherein each of said corresponding one or more resource meters transmits corresponding radio signals indicative of its corresponding meter identifiers and its corresponding current readings, and wherein one or more of said resource monitors are configured to:
         determine if one or more of said corresponding radio signals of said corresponding one or more resource meters within said corresponding radio ranges of said one or more of said resource monitors are of a fixed frequency or frequency hopping transmission protocol by scanning each of a plurality of frequency channels for a prescribed time period and counting hits of desired meter identifiers within said each of said plurality of frequency channels;
         decode each of said one or more of said corresponding radio signals of said corresponding one or more resource meters within said corresponding radio ranges of said one or more of said resource monitors according to a determined transmission protocol to obtain one or more of said corresponding meter identifiers and said corresponding current readings of said one or more of said resource meters within said corresponding radio ranges of said one or more of said resource monitors; and
         transmit said one or more of said corresponding meter identifiers and said corresponding current readings of said one or more of said resource meters within said corresponding radio ranges of said one or more of said resource monitors over the internet cloud to said resource server;
      wherein said meter reading processor creates and updates a corresponding plurality of records in a resource database that indicate resource consumption of corresponding facilities; and
   an engagement processor, that causes alerts to be transmitted to one or more client devices based on analyses of corresponding resource consumption, wherein said alerts notify corresponding users of said unusual patterns of resource consumption.

2. The system as recited in claim 1, wherein one or more of said corresponding one or more resource meter within corresponding radio ranges of said resource monitors comprise automatic meter reading (AMR) meters.

3. The system as recited in claim 1, wherein one or more of said corresponding one or more resource meters within corresponding radio ranges of said resource monitors comprise advanced metering infrastructure (AMI) meters.

4. The system as recited in claim 1, wherein a tunable narrow band receiver within each of said one or more of said resource monitors scans specified narrowband frequency bands to detect and decode said corresponding radio signals of said corresponding one or more resource meters within said corresponding radio ranges of said one or more of said resource monitors.

5. The system as recited in claim 1, wherein each of said one or more of said resource monitors transmits said one or more of said corresponding meter identifiers and said corresponding current readings of said one or more of said resource meters within said corresponding radio ranges of said one or more of said resource monitors over the internet cloud to said resource server at least every 30 seconds.

6. The system as recited in claim 1, wherein said alerts comprise prescribed messages from resource providers.

7. The system as recited in claim 6, wherein said alerts comprise push notifications that are transmitted to user client devices.

8. A system for instantaneous resource monitoring and engagement, the system comprising:
 a resource server, coupled to an internet cloud, that monitors use of a resource, and that engages resource users when unusual patterns of resource consumption are detected, said resource server comprising:
  a meter reading processor, configured to communicate with resource monitors that are each disposed within corresponding radio ranges of corresponding one or more resource meters, wherein each of said corresponding one or more resource meters transmits corresponding radio signals indicative of its corresponding meter identifiers and its corresponding current readings, and wherein one or more of said resource monitors are configured to:
   determine if one or more of said corresponding radio signals of said corresponding one or more resource meters within said corresponding radio ranges of said one or more of said resource monitors are of a fixed frequency or frequency hopping transmission protocol by scanning each of a plurality of frequency channels for a prescribed time period and counting hits of desired meter identifiers within said each of said plurality of frequency channels;
   decode each of said one or more of said corresponding radio signals of said corresponding one or more resource meters within said corresponding radio ranges of said one or more of said resource monitors according to a determined transmission protocol to obtain one or more of said corresponding meter identifiers and said corresponding current readings of said one or more of said resource meters within said corresponding radio ranges of said one or more of said resource monitors; and
   transmits said one or more of said corresponding meter identifiers and said corresponding current readings of said one or more of said resource meters within said corresponding radio ranges of said one or more of said resource monitors over the internet cloud to said resource server;
  wherein said meter reading processor creates and updates a corresponding plurality of records in a resource database that indicate resource consumption of corresponding facilities;
  a disaggregation processor, configured to analyze said corresponding plurality of records to distinguish between normal and abnormal usage patterns by said corresponding facilities, and to detect said unusual patterns of resource consumption; and
  an engagement processor, that causes alerts to be transmitted to one or more client devices based on analyses of corresponding resource consumption, wherein said alerts notify corresponding users of said unusual patterns of resource consumption.

9. The system as recited in claim 8, wherein one or more of said corresponding one or more resource meters within corresponding radio ranges of said resource monitors comprise automatic meter reading (AMR) meters.

10. The system as recited in claim 8, wherein one or more of said corresponding one or more resource meters within corresponding radio ranges resource monitors comprise advanced metering infrastructure (AMI) meters.

11. The system as recited in claim 8, wherein a tunable narrow band receiver within each of said one or more of said resource monitors scans specified narrowband frequency bands to detect and decode said corresponding radio signals of said said corresponding one or more resource meters within corresponding radio ranges of said one or more of said resource monitors.

12. The system as recited in claim 8, wherein each of said one or more of said resource monitors transmits said one or more of said corresponding meter identifiers and said corresponding current readings of said one or more of said resource meters within said corresponding radio ranges of said one or more of said resource monitors over the internet cloud to said resource server at least every 30 seconds.

13. The system as recited in claim 8, wherein said alerts comprise prescribed messages from resource providers.

14. The system as recited in claim 13, wherein said alerts comprise push notifications that are transmitted to user client devices.

15. A method for instantaneous resource monitoring and engagement, the method comprising:
 monitoring use of a resource, said monitoring comprising:
  communicating with resource monitors that are each disposed within corresponding radio ranges of corresponding one or more resource meters, wherein each of the corresponding one or more resource meters of each of the plurality of resource monitors transmits corresponding radio signals indicative of its corresponding meter identifiers and its corresponding current readings, and wherein one or more of the resource monitors:
   determine if one or more of the corresponding radio signals of the corresponding one or more resource meters within the corresponding radio ranges of the one or more of the resource monitors are of a fixed frequency or frequency hopping transmission protocol by scanning each of a plurality of frequency channels for a prescribed time period and counting hits of desired meter identifiers within the each of the plurality of frequency channels;
   decode each of the one or more of the corresponding radio signals of the corresponding one or more resource meters within the corresponding radio ranges of the one or more of the resource monitors according to a determined transmission protocol to obtain one or more of said corresponding meter identifiers and said corresponding current readings of said one or more of said resource meters within said corresponding radio ranges of said one or more of said resource monitors; and
   transmit the one or more of said corresponding meter identifiers and said corresponding current readings of said one or more of said resource meters within said corresponding radio ranges of said one or more of said resource monitors over the internet cloud to the resource server;

creating and updating a corresponding plurality of records in a resource database that indicate resource consumption of corresponding facilities; and transmitting alerts to one or more client devices based on analyses of corresponding resource consumption, wherein the alerts notify corresponding users of unusual patterns of resource consumption.

16. The method as recited in claim 15, wherein one or more of the corresponding one or more resource meters within corresponding radio ranges of the resource monitors comprise automatic meter reading (AMR) meters.

17. The method as recited in claim 15, wherein one or more of the corresponding one or more resource meters within corresponding radio ranges or the resource monitors comprise advanced metering infrastructure (AMI) meters.

18. The method as recited in claim 15, wherein a tunable narrow band receiver within each of the one or more of the resource monitors scans specified narrowband frequency bands to detect and decode the corresponding radio signals or the corresponding one or more resource meters within the corresponding radio ranges of the one or more of the resource monitors.

19. The method as recited in claim 15, wherein each of the one or more of the resource monitors transmits the one or more of said corresponding meter identifiers and said corresponding current readings of said one or more of said resource meters within said corresponding radio ranges of said one or more of said resource monitors over the internet cloud to the resource server at least every 30 seconds.

20. The method as recited in claim 15, wherein the alerts comprise prescribed messages from resource providers.

* * * * *